United States Patent
Morrison et al.

(10) Patent No.: US 12,153,268 B2
(45) Date of Patent: Nov. 26, 2024

(54) TECHNOLOGIES FOR INCREASED VOLUMETRIC AND FUNCTIONAL EFFICIENCIES OF OPTICAL PACKAGES

(71) Applicant: Apple Inc., Cupertino, CA (US)

(72) Inventors: Scott D. Morrison, Austin, TX (US); Bilal Mohamed Ibrahim Kani, Singapore (SG); Kishore N. Renjan, Singapore (SG); Kyusang Kim, Singapore (SG); Lan H. Hoang, Los Gatos, CA (US); Manoj Vadeentavida, Singapore (SG)

(73) Assignee: Apple Inc., Cupertino, CA (US)

( * ) Notice: Subject to any disclaimer, the term of this patent is extended or adjusted under 35 U.S.C. 154(b) by 30 days.

(21) Appl. No.: 17/646,784

(22) Filed: Jan. 3, 2022

(65) Prior Publication Data

US 2023/0213715 A1 Jul. 6, 2023

(51) Int. Cl.
*G02B 6/42* (2006.01)
*F21V 8/00* (2006.01)

(52) U.S. Cl.
CPC ........... *G02B 6/428* (2013.01); *G02B 6/0028* (2013.01); *G02B 6/0065* (2013.01); *G02B 6/0081* (2013.01); *G02B 6/4283* (2013.01)

(58) Field of Classification Search
CPC .... G02B 6/428; G02B 6/0028; G02B 6/0065; G02B 6/0081; G02B 6/4283
See application file for complete search history.

(56) References Cited

U.S. PATENT DOCUMENTS

| | | | | |
|---|---|---|---|---|
| 5,596,663 A * | 1/1997 | Ishibashi | ............ | G02B 6/4246 361/785 |
| 6,518,638 B1 * | 2/2003 | Kuhara | ............ | H01L 31/02164 257/431 |
| 8,623,753 B1 * | 1/2014 | Yoshida | ................ | H01L 25/105 257/690 |
| 8,750,657 B2 * | 6/2014 | Levy | .................... | G02B 6/4292 385/14 |
| 9,030,832 B2 * | 5/2015 | Kwong | ................ | G01S 7/4811 361/752 |
| 9,406,658 B2 * | 8/2016 | Lee | ...................... | H01L 23/5389 |
| 9,786,617 B2 * | 10/2017 | Liu | ........................ | H01L 24/19 |
| 9,905,722 B1 * | 2/2018 | Chen | ...................... | G01S 17/04 |
| 9,911,629 B2 * | 3/2018 | Hsu | ........................ | H01L 21/78 |
| 10,270,007 B2 * | 4/2019 | Kim | ...................... | H01L 33/502 |
| 10,312,423 B2 * | 6/2019 | Cheng | .................... | H01L 33/60 |
| 10,711,268 B2 * | 7/2020 | Murakami | ......... | C12N 15/1062 |
| 10,824,007 B2 * | 11/2020 | Li | ....................... | G02F 1/133603 |
| 10,838,144 B2 * | 11/2020 | Chin | ................... | G02B 6/12004 |
| 11,133,423 B2 * | 9/2021 | Tsai | ................... | H01L 31/02002 |
| 11,282,995 B2 * | 3/2022 | Kim | ........................ | H01L 33/62 |

(Continued)

*Primary Examiner* — Andrew Jordan
(74) *Attorney, Agent, or Firm* — Aikin & Gallant, LLP

(57) ABSTRACT

Optical packages and methods of assembly are described in which various optical structures are integrated to increase efficiency. In an embodiment, an optical package includes an optical component with integrated guard fence to prevent the flow of adjacent opaque insulating material onto an optical surface. Additional optic structures are described such as light blocking structures within routing layer to reduce total internal reflection (TIR) within the routing layers, optical lenses, and the use of sacrificial layers to protect optical surfaces of the optical components during assembly.

8 Claims, 22 Drawing Sheets

(56) References Cited

U.S. PATENT DOCUMENTS

| | | | | |
|---|---|---|---|---|
| 11,552,053 B2* | 1/2023 | Kani | | H01L 24/19 |
| 2005/0047729 A1* | 3/2005 | Vilgiate | | G02B 6/4292 |
| | | | | 385/92 |
| 2005/0185389 A1* | 8/2005 | Henriet | | G02B 6/0018 |
| | | | | 362/23.15 |
| 2008/0048095 A1* | 2/2008 | Matheson | | H05B 45/30 |
| | | | | 250/201.1 |
| 2008/0121898 A1* | 5/2008 | Yin | | G02B 6/0083 |
| | | | | 257/E33.056 |
| 2008/0308928 A1* | 12/2008 | Chang | | H01L 27/14618 |
| | | | | 257/723 |
| 2009/0045986 A1* | 2/2009 | Fabrenius | | G06F 3/0202 |
| | | | | 341/22 |
| 2009/0086508 A1* | 4/2009 | Bierhuizen | | G02B 6/0023 |
| | | | | 362/617 |
| 2009/0115049 A1* | 5/2009 | Shiraishi | | B81C 1/0023 |
| | | | | 257/E23.18 |
| 2010/0295442 A1* | 11/2010 | Harbers | | G02B 6/0078 |
| | | | | 313/501 |
| 2011/0064362 A1* | 3/2011 | Slavov | | H05K 1/0274 |
| | | | | 385/88 |
| 2012/0217049 A1* | 8/2012 | Hanai | | H05K 3/4697 |
| | | | | 174/260 |
| 2013/0148125 A1 | 6/2013 | Shibayama et al. | | |
| 2013/0221470 A1* | 8/2013 | Kinsman | | H01L 27/14618 |
| | | | | 257/434 |
| 2014/0036161 A1* | 2/2014 | Lin | | G02B 6/0068 |
| | | | | 348/801 |
| 2014/0097536 A1* | 4/2014 | Schunk | | H01L 23/3107 |
| | | | | 257/738 |
| 2014/0133797 A1* | 5/2014 | Levy | | G02B 6/425 |
| | | | | 29/832 |
| 2014/0192279 A1* | 7/2014 | Akanuma | | G02B 6/0075 |
| | | | | 349/12 |
| 2014/0296411 A1* | 10/2014 | Cheng | | C08K 3/22 |
| | | | | 524/451 |
| 2015/0001713 A1* | 1/2015 | Goetz | | H01L 24/19 |
| | | | | 257/734 |
| 2015/0028359 A1* | 1/2015 | Tu | | H01L 33/54 |
| | | | | 257/82 |
| 2015/0098025 A1* | 4/2015 | Mouri | | H04N 5/64 |
| | | | | 348/790 |
| 2015/0109775 A1* | 4/2015 | Schwalenberg | | F21V 23/0457 |
| | | | | 362/231 |
| 2015/0262984 A1* | 9/2015 | Krabe | | H01L 24/96 |
| | | | | 438/107 |
| 2015/0287708 A1* | 10/2015 | Lin | | H01L 23/5389 |
| | | | | 438/109 |
| 2016/0308329 A1* | 10/2016 | Ishii | | G02B 6/4278 |
| 2016/0313593 A1* | 10/2016 | Grip | | G02F 1/133514 |
| 2017/0053903 A1* | 2/2017 | Nishimura | | H01L 25/50 |
| 2017/0075066 A1* | 3/2017 | Houbertz | | G02B 6/4257 |
| 2017/0084589 A1* | 3/2017 | Kuo | | H01L 23/3128 |
| 2017/0207200 A1 | 7/2017 | Lin et al. | | |
| 2017/0345864 A1* | 11/2017 | Kinsman | | H01L 27/14618 |
| 2018/0145224 A1* | 5/2018 | Kim | | H01L 33/0075 |
| 2018/0182913 A1* | 6/2018 | Chen | | G01S 17/04 |
| 2018/0301443 A1* | 10/2018 | Kim | | H01L 23/367 |
| 2019/0067244 A1* | 2/2019 | Chen | | H01L 24/80 |
| 2019/0076036 A1* | 3/2019 | Lasarov | | G02B 6/08 |
| 2019/0166684 A1* | 5/2019 | Bird | | H01S 5/02345 |
| 2019/0187371 A1* | 6/2019 | Chin | | G02B 6/122 |
| 2019/0229144 A1* | 7/2019 | Kinsman | | H01L 27/14618 |
| 2019/0341505 A1* | 11/2019 | Liu | | H01L 23/3121 |
| 2020/0006088 A1* | 1/2020 | Yu | | H01L 23/5386 |
| 2020/0012086 A1* | 1/2020 | Kawahara | | G02B 23/2469 |
| 2020/0088934 A1* | 3/2020 | Fu | | G02B 6/0073 |
| 2020/0310052 A1 | 10/2020 | Lim et al. | | |
| 2021/0005761 A1* | 1/2021 | Tsai | | H01L 25/165 |
| 2021/0090908 A1* | 3/2021 | Renjan | | H01L 25/0655 |
| 2021/0405313 A1* | 12/2021 | Kani | | H01L 24/43 |
| 2022/0020885 A1* | 1/2022 | Tsai | | H01L 25/162 |
| 2022/0131339 A1* | 4/2022 | Ohara | | H01L 33/62 |
| 2022/0244445 A1* | 8/2022 | Chen | | H01H 13/705 |
| 2023/0213715 A1* | 7/2023 | Morrison | | G02B 6/0081 |
| | | | | 385/94 |

\* cited by examiner

TECHNOLOGIES FOR INCREASED VOLUMETRIC AND FUNCTIONAL EFFICIENCIES OF OPTICAL PACKAGES

BACKGROUND

Field

Embodiments described herein relate to microelectronic packaging, and more specifically to optical packages.

Background Information

As microelectronic devices become increasingly smaller and more portable, sensors are increasingly being incorporated in order to detect the environment or context associated with use of the devices. Among such sensors include light sensors or proximity sensors, which can detect ambient light or proximity to a target object such as a user's ear or face. In one implementation a proximity sensor can include a light source and photodetector (PD). In application, the PD may detect proximity to a target object by measuring the amount of light from the light source.

SUMMARY

Embodiments describe packages and methods of assembly in which various optical structures are integrated with optical components to increase efficiency. In an embodiment, the optical components may be configured with an integrated guard fence to prevent the flow of adjacent opaque insulating material onto an optical surface. In an embodiment, routing layers can be formed with transparent dielectric materials. Light blocking structures may be integrated within the routing layers to reduce total internal reflection (TIR) within the routing layers, thus mitigating cross-talk between adjacent optical components. In an embodiment, an optical lens can be fabricated over an optical component in-situ with the insulating encapsulation material used to secure the optical component within a cavity in a package printed circuit board (PCB) core. In an embodiment, a sacrificial layer is employed during assembly to protect optical surfaces of the optical components. The sacrificial layer may be wholly removed, or a residual portion of the sacrificial layer may remain in the assembled product.

DETAILED DESCRIPTION

Figure 1:
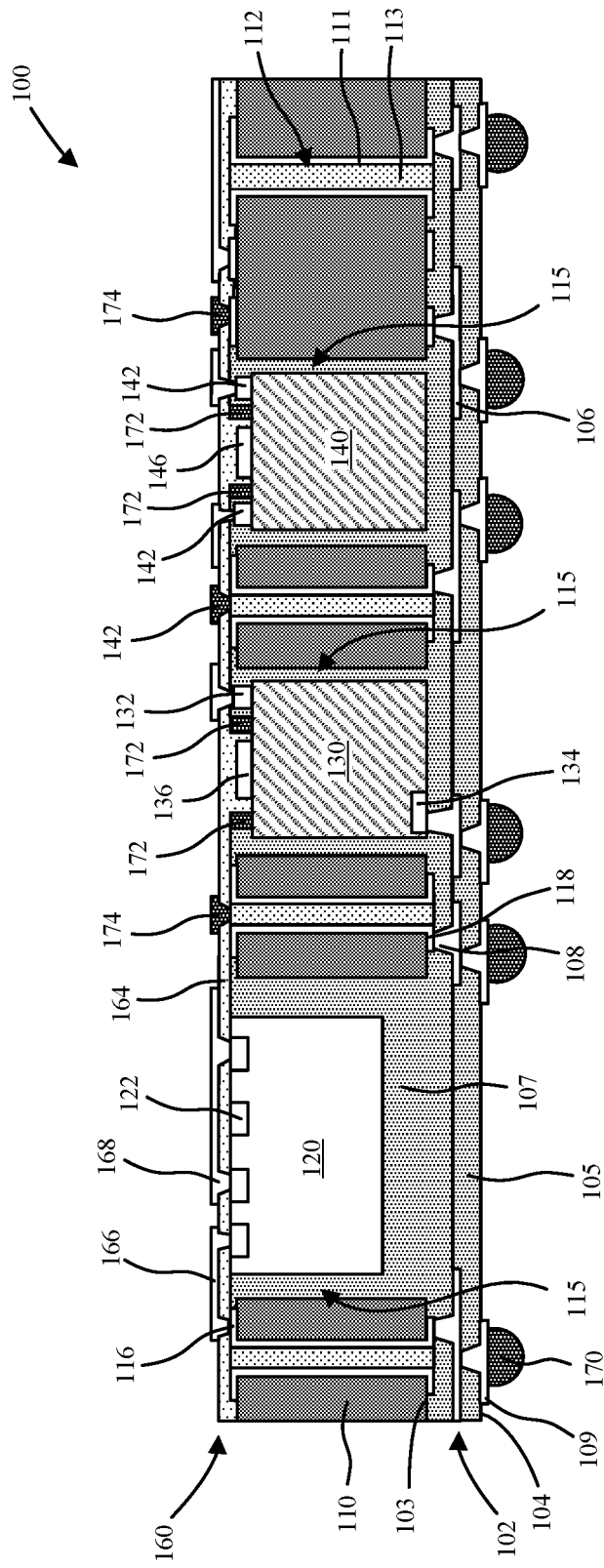
FIG. 1 is a schematic cross-sectional side view illustration of an optical package including side-by-side controller chip and optical components in accordance with an embodiment.

Embodiments describe optical packages and methods of fabrication. In particular, the optical packages may be incorporated as light sensors or proximity sensors in portable electronic devices. In one aspect, the optical packages in accordance with embodiments embed a controller chip along with one or more photodetectors (PDs) and one or more emitters in a single package. The controller chip may function to control operation of the one or more PDs and emitters. For example, the controller chip can be an application specific integrated circuit (ASIC) or field-programmable gate array (FPBA). It has been observed that traditional optical packages for proximity sensors mount the PD and light source onto a flex circuit. This end of the flex circuit can be mounted to a housing, while the opposite end of the flex circuit is routed to a controller on a circuit board located elsewhere in the housing. It has been observed that such a configuration can be particularly susceptible to mechanical shock, as well as to external electromagnetic interference (EMI). In one aspect the optical packages and methods of fabrication in accordance with embodiments provide an alternative layout and form factor compared to traditional optical packages. In accordance with embodiments, the controller chip and optical components (emitters, PDs) are surface mounted during fabrication of the main circuit board, saving space by removing the flex circuit and separate board assemblies for the controller chip and optical components. Mechanical shock can be mitigated by embedding the multiple components into a single package, rather than having multiple components connected on opposite ends of a flex circuit. Furthermore, the optical packages in accordance with embodiments may be considered a system-in-package which allows for standalone testing and calibration.

In another aspect, embodiments describe various optical structures that can be integrated into the optical packages to increase efficiency. In an embodiment, the optical components may be configured with an integrated guard fence to prevent the flow of adjacent opaque insulating material onto an optical surface. In an embodiment, routing layers can be formed with transparent dielectric materials. Light blocking structures may be integrated within the routing layers to reduce total internal reflection (TIR) within the routing layers, thus mitigating cross-talk between adjacent optical components. In an embodiment, an optical lens can be fabricated over an optical component in-situ with the insulating encapsulation material used to secure the optical component within a cavity in the package printed circuit board (PCB). In an embodiment, a sacrificial layer is employed during assembly to protect optical surfaces of the optical components. The sacrificial layer may be wholly removed, or a residual portion of the sacrificial layer may remain in the assembled product.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of an optical package 100 including side-by-side controller chip 120 and optical components, including one or more emitters 140 and PDs 130, in accordance with an embodiment. Specifically, the optical package 100 illustrated in FIG. 1 includes a combination of optical structures for increasing efficiency including guard fences 172 integrated with the optical components and light blocking structures 174 integrated within an overlying routing layer 160.

The one or multiple different emitters 140 may be designed to emit at different wavelengths, or intensities. In an embodiment, an optical package 100 includes a back side routing layer 102 including a top side 103 and bottom side 104, and a printed circuit board (PCB) core 110 on the top side 103 of the back side routing layer 102. The PCB core 110 may include a plurality of vertical vias 112 and a plurality of cavities 115. An optical component, such as emitter 140 or PD 130 can be located within a cavity 115, where a top side of the optical component includes a guard fence 172 surrounding an optical surface 146, 136 of the optical component. A controller chip 120 may also be located within another cavity 115.

In accordance with embodiments, one or more, or all, optical components may include a guard fence 172. One or more insulating materials 107 can be applied within the cavities 115 to encapsulate the optical components within the cavities. In accordance with embodiments, the insulating material(s) do not penetrate inside the guard fence(s). As will become more apparent in the following description, the guard fence 172 may block the flow of insulating material 107 when applying the insulating material over an optical component when mounted face down onto a temporary carrier during package assembly. The insulating material 107 may be formed of a suitable molding material, including epoxy, and more flexible materials such as silicone. A front side routing layer 160 may be located on top of the optical component(s), controller chip 120, and the PCB core 110. In some embodiments, the front side routing layer 160 includes a transparent dielectric layer 164 spanning over the optical component(s) and the controller chip. The optical package 100 may additionally include a plurality of solder bumps 170 on the bottom side 104 of the back side routing layer 102, for example, for mounting on a mother board or other system component of an electronic device.

In the particular embodiment illustrated in FIG. 1, the front side routing layer 160 may span directly over the controller chip 120 and one or more optical components (e.g. PDs 130, emitters 140). More specifically, the transparent dielectric layer 164 can span directly over the controller chip 120 and one or more optical components, including the optical surfaces 146 thereof. Alternatively, apertures can be formed through the front side routing layer 160 to expose the optical surfaces 136, 146.

In accordance with embodiments, the PCB core 110 may be a laminate body. For example, the PCB core 110 can be a composite of woven fiberglass cloth and polymer (e.g. resin). The PCB core 110 may be formed of a variety of suitable PCB materials including FR4, prepreg, polyimide, etc. The PCB core 110 may be rigid or flexible. Vertical vias 112 may be copper pillars, for example, formed using a plating technique after drilling via holes through the PCB core 110. The PCB core 110 may include top side landing pads 116, and bottom side landing pads 118. The vertical vias 112 may be formed using a variety of interconnection techniques, such as stacked vias, a single metal-filled via (e.g. column), or via openings as illustrated in FIG. 1 with metal sidewall liner 111, and optional filler 113, which can be insulating or electrically conducting. The sidewall liner 111 may be continuous with the top side landing pads 116 and bottom side landing pads 118.

The optical components in accordance with embodiments may be vertical components including top terminals and bottom terminals, or horizontal components with terminals on a single side (top or bottom). For illustrational purposes only, in the exemplary embodiment illustrated in FIG. 1 the PD 130 may have a top terminal 132 and bottom terminal 134, and the emitter 140 may have top terminals 142 only. Though this is exemplary, and either optical component can include only top terminals, or top and bottom terminals.

The front side routing layer 160 may include vias 168 or contact pads that are formed on, and may be directly on, the top terminal(s) 132 of the PD 130, and top terminal(s) 142 of the emitters 140. Vias 168 or contact pads may also be formed on, and may be directly on, the contact pads 122 of a face-up controller chip 120, and the vertical vias 112 or top side landing pads 116.

In an embodiment such as that illustrated in FIG. 1, the front side routing layer 160 can be a front redistribution layer (RDL), which may be formed directly on the underlying structure in a layer-by-layer process using thin film processing or lamination techniques. For example, a front RDL may include one or more wiring traces 166, one or more dielectric layers 164, vias 168, and contact pads. The RDL may be formed of suitable materials. For example, the dielectric layer(s) 164 may be formed of a dielectric material including polymers (e.g. polyimide, epoxy, epoxy blends, etc.), while the wiring traces 166 and vias 168 may be formed of a suitable metal, including copper. In some embodiments the dielectric layer(s) 164 are formed of a transparent material.

In an embodiment such as that illustrated in FIG. 1, the back side routing layer 102 is an RDL. The back side routing layer 102 may be formed similarly as the front side routing layer 160 previously described. The back side routing layer 102 can include one or more dielectric layers 105, vias 108, contact pads 109, and optionally wiring traces 106. In an embodiment, the insulating material 107 used to secure the optical components and/or controller chip 120 can form a part of the back side routing layer 102, for example with vias 108 extending through to contact the bottom side landing pads 118 or back side terminals of the optical components, such as terminal 134 of PD 130 (or emitter 140). Dielectric layers 105 may be formed of the same or different material as dielectric layers 164 or insulating material 107.

Figure 2:
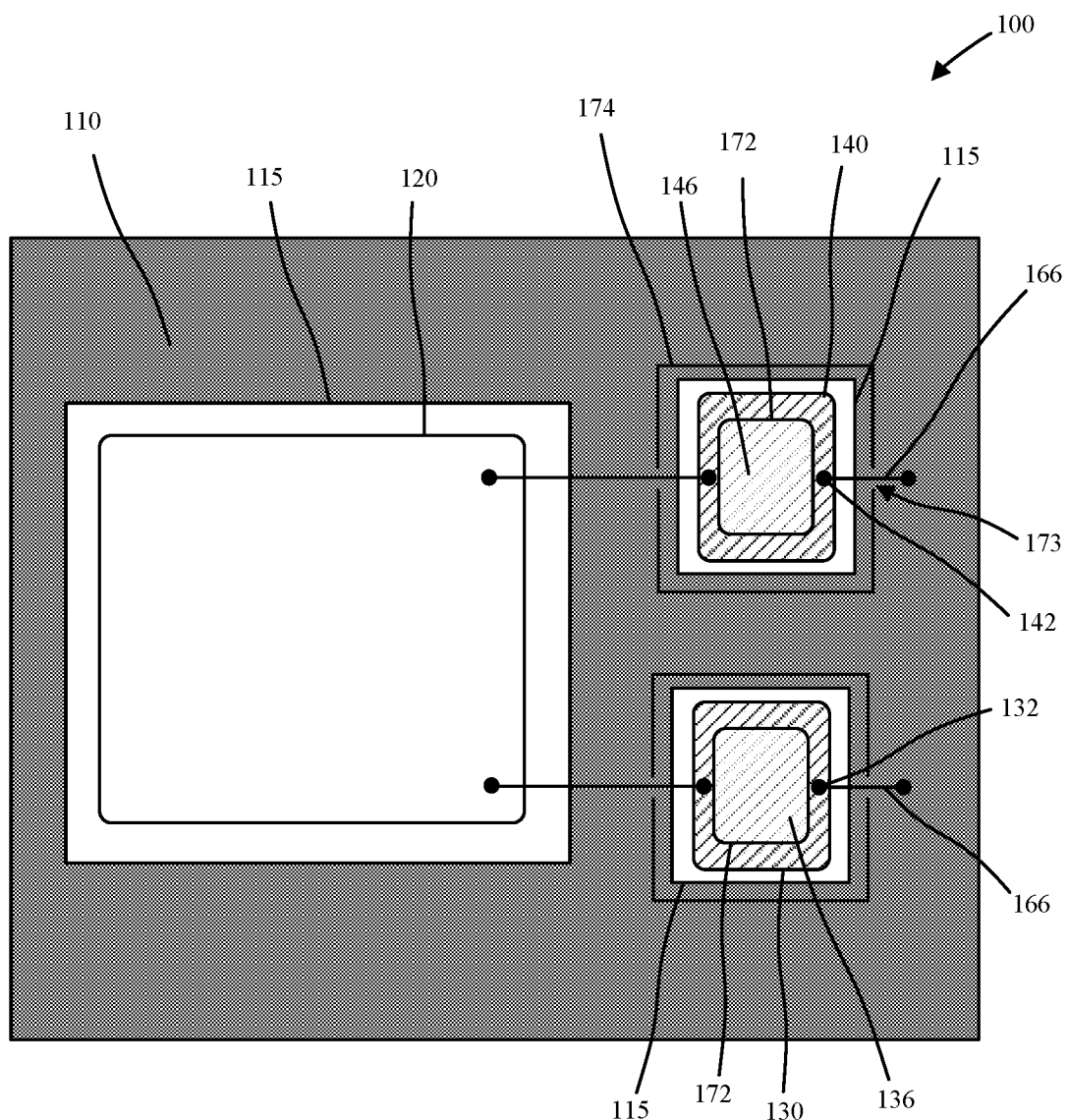
FIG. 2 is a schematic top view illustration of an optical package including side-by-side controller chip and optical components in accordance with an embodiment.

FIG. 2 is a schematic top view illustration of an optical package 100 including side-by-side controller chip 120 and optical components (e.g. PD 130, emitter 140) in accordance with an embodiment. As shown, the controller chip 120, PD 130 and emitter 140 are mounted within corresponding cavities 115 in the PCB core 110 as described with regard to FIG. 1. Either or both of the PD 130 and emitter 140 can include a guard fence 172 surrounding a corresponding optical surface 136, 146. Additionally, or alternatively, one or more light blocking structures 174 can be formed in the front side routing layer 160 (see FIG. 1). For example, the light blocking structure 174 can be a wall between adjacent optical components, such as an opaque metal wall formed of the same material (e.g. copper) used to form wiring traces 166 and vias 168. In the illustrated embodiment the light blocking structures 174 can laterally surround the optical surfaces 136, 146 of the optical components. As shown, the light blocking structures 174 can laterally surround the outside perimeters of the optical components. There may additionally be openings 173 within the light blocking structures, for example to allow wiring trace 166 routing to pass through. For example, the wiring trace 166 routing may connect the optical components to the controller chip 120. In an embodiment, the openings 173 in the light blocking structures 174 are not between the adjacent optical components, and instead may be located along another side not facing an optical component.

In accordance with embodiments, various optical structures can be integrated into the optical packages to increase efficiency. For example, such optical structures can include an integrated guard fence to prevent the flow of adjacent opaque insulating material onto an optical surface, a light blocking structure to reduce TIR, and optical lenses. Furthermore, different optical structures may be combined depending upon application. In the following description, various optical structures and methods of fabrication are described separately. Furthermore, the following figures and description is made with regard to a PD 130, though this is exemplary and the following optical structures are applicable for other optical components, include emitters 140, etc.

Figure 3:
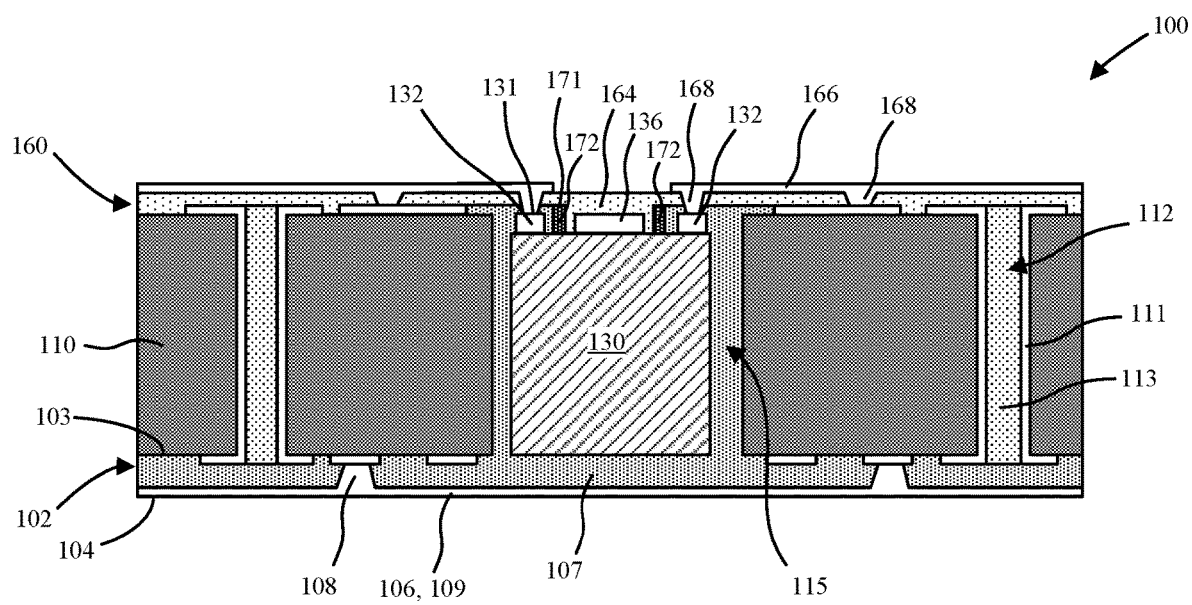
FIG. 3 is a schematic cross-sectional side view illustration of an optical package including an optical component with a guard fence in accordance with an embodiment.
Figure 4:
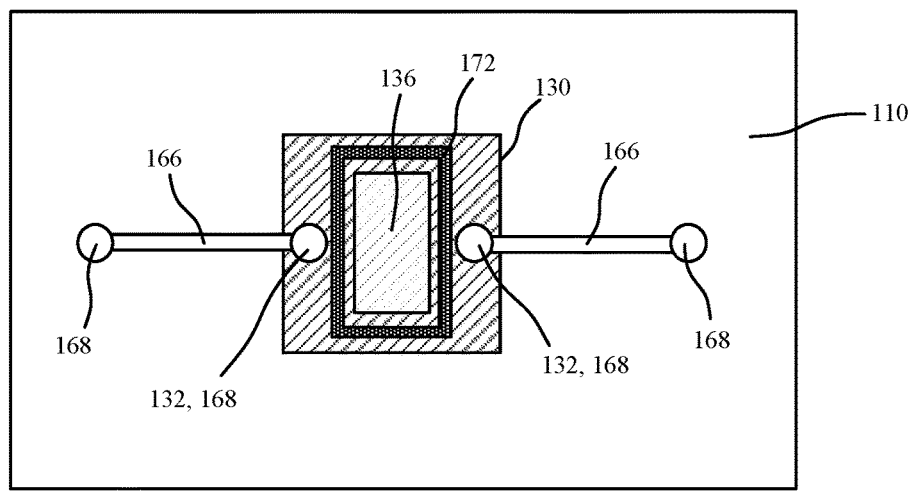
FIG. 4 is a top view illustration of an optical package including an optical component with a guard fence in accordance with an embodiment.
Figure 5:
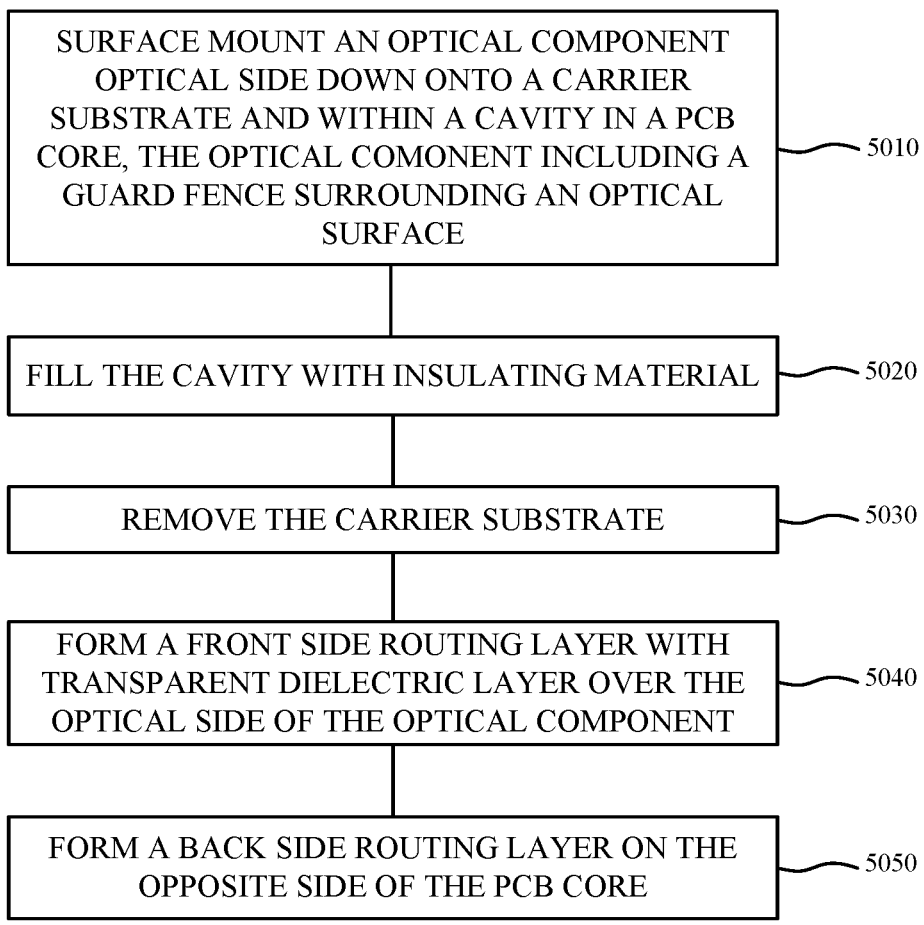
FIG. 5 is a process flow of a method of fabricating an optical package including an optical component with a guard fence in accordance with an embodiment.

Referring now to FIGS. 3-4, schematic cross-sectional side view and top view illustrations are provided of an optical package 100 including an optical component (e.g. PD 130) with a guard fence 172 in accordance with an embodiment. In an embodiment, an optical package 100 includes a back side routing layer 102 including a top side 103 and a bottom side 104. A PCB core 110 is on the top side 103 of the back side routing layer 102. The PCB core additionally includes a plurality of vias 112 and a first cavity 115. An optical component (e.g. PD 130) is mounted within the first cavity 115, where a top side of the optical component includes a guard fence 172 surrounding an optical surface 136. An insulating material 107 encapsulates the optical component within the first cavity 115 and does not penetrate inside the guard fence 172. A front side routing layer 160 is additionally formed on top of the PCB core 110 and the optical component. In accordance with embodiments, the front side routing layer 160 may include a transparent dielectric layer 164 spanning over the optical component.

In accordance with embodiments the insulating material 107 may be opaque, and the guard fence 172 functions to prevent the flow of the insulating material 107 over the optical surface 136. The transparent dielectric layer 164 however can at least partially fill a volume inside the guard fence, and optionally cover the optical surface 136. The top side of the optical component can include at least one first contact terminal 132, and the front side routing layer 160 includes a wiring trace 166 in electrical contact with the first contact terminal 132, such as with via 168. As shown, the contact terminal(s) 132 can be located outside of the guard fence 172. Furthermore, a surrounding top surface 171 of the guard fence 172 can be elevated above a first top surface 131 of the first contact terminal 132. In this manner, the insulating material 107 can flow over the contact terminal(s) 132, and vias 168 can extend through the insulating material 107 to contact the contact terminals. The guard fences 172 can be formed of one or more metal layers used to form the contact terminals 132, 142 or any other material suitable for blocking flow of the insulating material 107. The guard fence may be opaque. For example, the guard fence 172 can be copper.

It is to be appreciated the illustrations of FIGS. 3-4 are close up illustrations, and the optical package 100 can further include a controller chip 120 mounted face up within a second cavity 115 in the PCB core 110, and the front side routing layer spans over and makes electrical contact with the controller chip 120. Additional optical components (e.g. emitter 140) can also be mounted in the PCB core 110 as previously described. In an exemplary embodiment, a portion of the insulating material 107 spans over a back side of the PCB core, and a plurality of vias 108 extend through the insulating material 107 to contact the PCB core.

Referring now to FIG. 5 and FIGS. 6A-6K, FIG. 5 is a process flow of a method of fabricating an optical package including an optical component with a guard fence in accordance with an embodiment; FIGS. 6A-6K are schematic cross-sectional side view illustrations of a method of fabricating an optical package including an optical component with a guard fence in accordance with an embodiment. In interested of clarity and conciseness FIG. 5 and FIGS. 6A-6K are discussed concurrently.

Figure 6A:
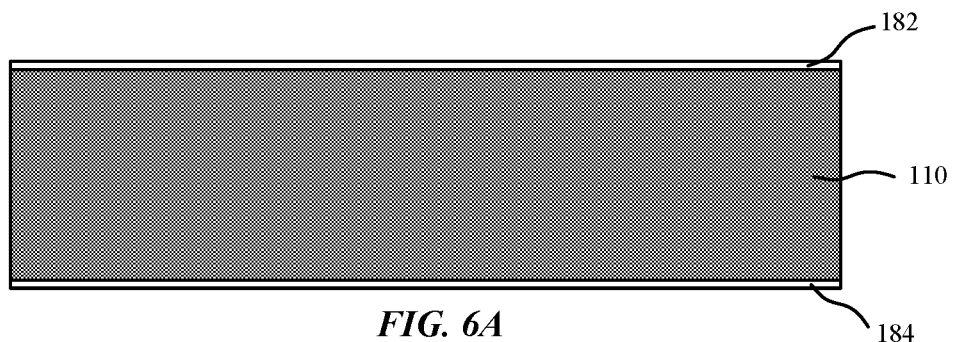
FIGS. 6A-6K are schematic cross-sectional side view illustrations of a method of fabricating an optical package including an optical component with a guard fence in accordance with an embodiment.
Figure 6B:
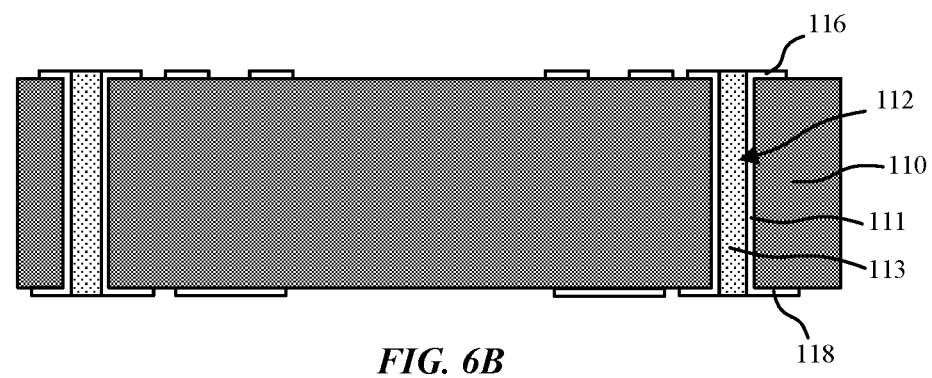
Figure 6C:
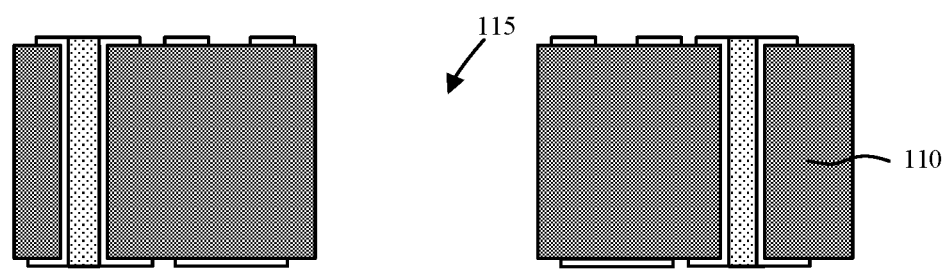
Figure 6D:
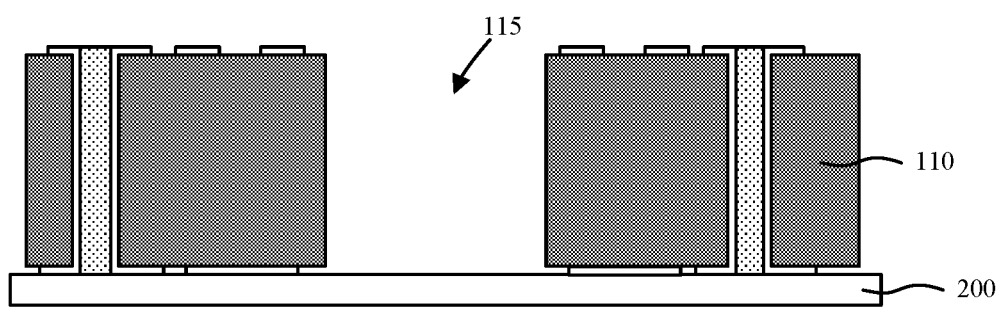

The process sequence may begin with a main core as shown in FIG. 6A, including a laminate body, top metal layer 182, and bottom metal layer 184. Vertical via openings can then be drilled (e.g. mechanical or laser) through the laminate body followed by plating to form sidewall liners 111 in the vertical via openings. The remainder of the vertical via openings may be filled with a conductive or insulating filler 113 to complete the vertical vias 112. The top and bottom metal layers 182, 184 may additionally be patterned to complete the formation of top side landing pads 116 and bottom side landing pads 118, and any additional routing or pads as illustrated in FIG. 6B. A plurality of cavities 115 can then be cut into the PCB core 110 (e.g. through the laminate substrate) as shown in FIG. 6C, followed by placing the PCB core 110 onto a carrier substrate 200, or laminating the carrier substrate 200 onto the PCB core 110 as shown in FIG. 6D.

Figure 6E:
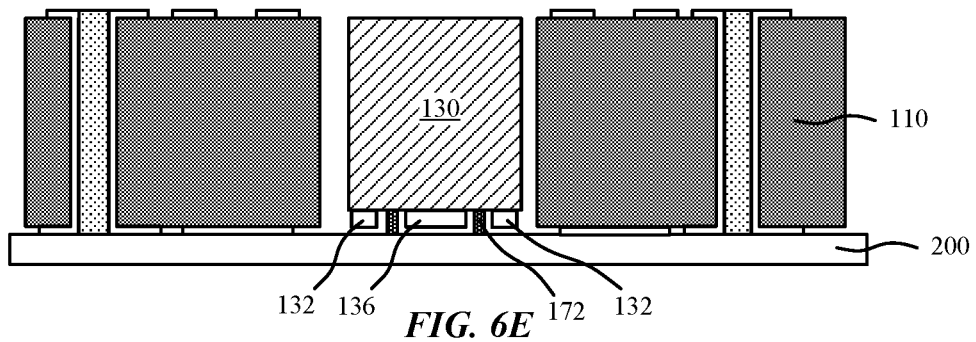
Figure 6F:
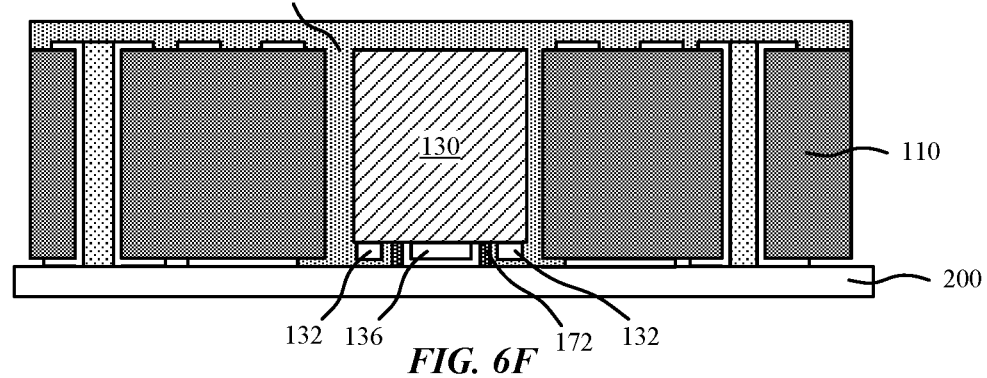

Referring now to FIG. 6E, at operation 5010 the one or more optical components are mounted optical side down (including the optical surface) onto the carrier substrate 200 and within a corresponding cavity 115 in the PCB core 110. As shown, the optical component includes a guard fence surrounding an optical surface 136. The optical component may additionally include one or more terminals 132 outside of the guard fence 172, wherein the guard fence 172 is taller than the terminals 132, or at least the same height as the terminals 132 so that uniform contact can be made with the carrier substrate 200 or intervening adhesive layer. An insulating material 107 is then applied over the optical component to fill the cavity 115 at operation 5020. The insulating material 107 may also span over the back side 117 of the PCB core 110. The insulating material 107 may be applied using a suitable dispensing technique (e.g. slot coat, ink jet printing, etc.), cavity molding technique, or lamination technique such as lay-up press in which a sheet of insulating material 107 is applied, heated, and pressed into shape. Each deposition technique may include flow of the insulating material 107, and as such the guard fence 172 can make intimate contact with the carrier substrate 200 or intermediate layer to prevent encroachment of the insulating material 107, particularly when formed of an opaque material that could degrade optical performance of the optical component.

Figure 6G:
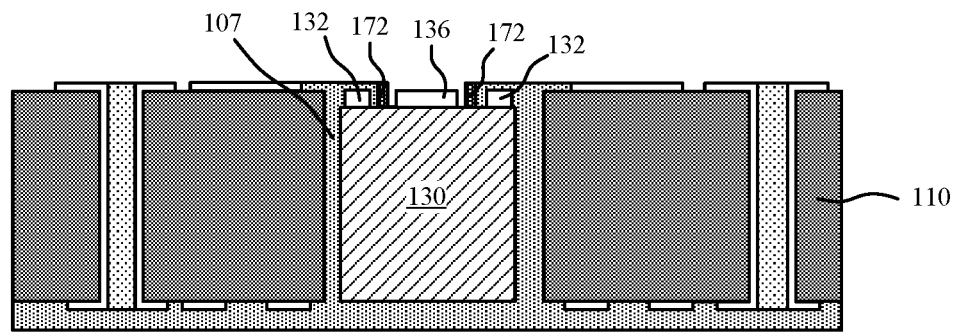

The carrier substrate 200 and any intermediate layer can then be removed at operation 5030, as shown in FIG. 6G, followed by the formation of a front side routing layer 160 at operation 5040 and back side routing layer 102 at operation 5050. The front side routing layer 160 and back side routing layer 102 be formed using suitable techniques such as thin film deposition and patterning, and Ajinomoto Buildup Film® process, or ABF. An exemplary ABF process includes dielectric layer lamination and cure, laser via formation, via plating, formation of mask layer, and metal plating to form wiring layers, and final cure. An alternative ABF process includes dielectric and metal layer lamination and cure, laser via formation, via plating, metal layer etching for wiring layer formation, and final cure.

Figure 6H:
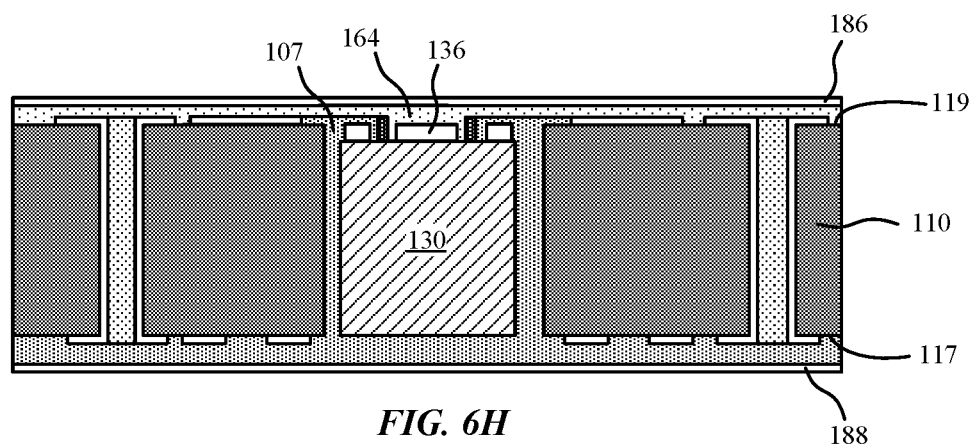
Figure 6I:
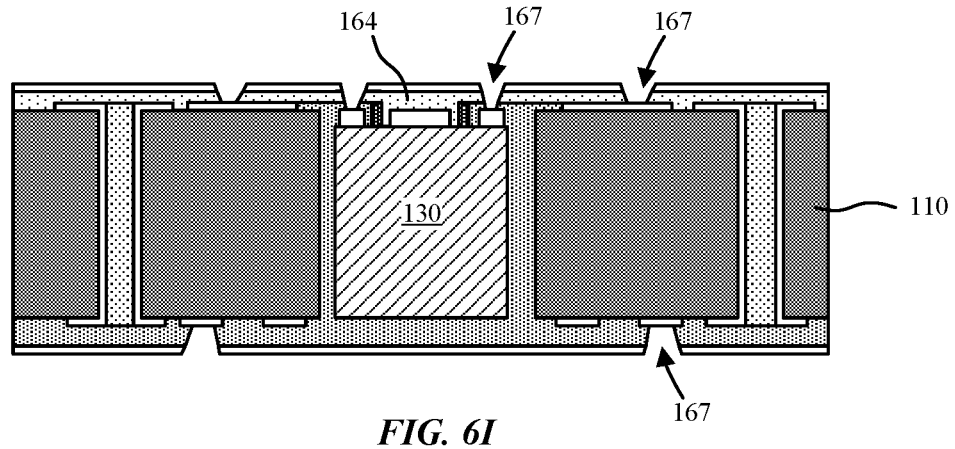
Figure 6J:
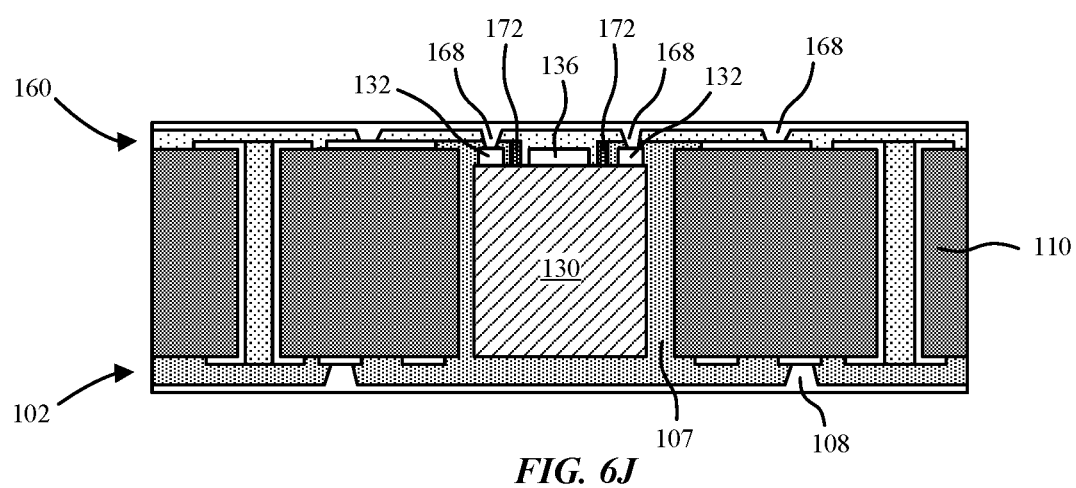

Referring now to FIG. 6H dielectric layer 164 and front side metal layer 186 are laminated onto the front side 119 of the PCB core 110, and back side metal layer 188 (and optional dielectric is optionally laminated onto the back side 117 of the PCB core 110, or more specifically onto the insulating material 107. Via openings 167 can then be formed through the dielectric layers or insulating material 107 as shown in FIG. 6I to expose optical component terminals or PCB core landing pads, followed by plating of vias 168 as shown in FIG. J. Imaging and etching may then be performed to pattern the wiring traces 166, 106 or remove any material over the optical surface of the optical component (e.g. optical surface 136 of PD 130). It is to be appreciated, this represents an exemplary fabrication sequence, though other fabrication sequences are possible for the formation of the routing layers.

Figure 7:
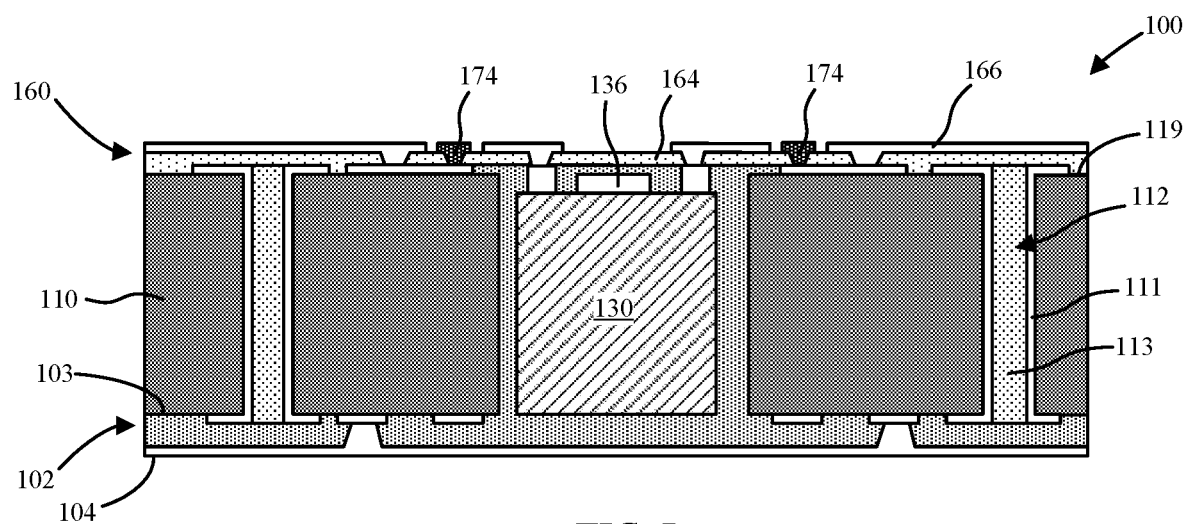
FIG. 7 is a schematic cross-sectional side view illustration of an optical package including a light blocking structure in a front side routing layer in accordance with an embodiment.
Figure 8:
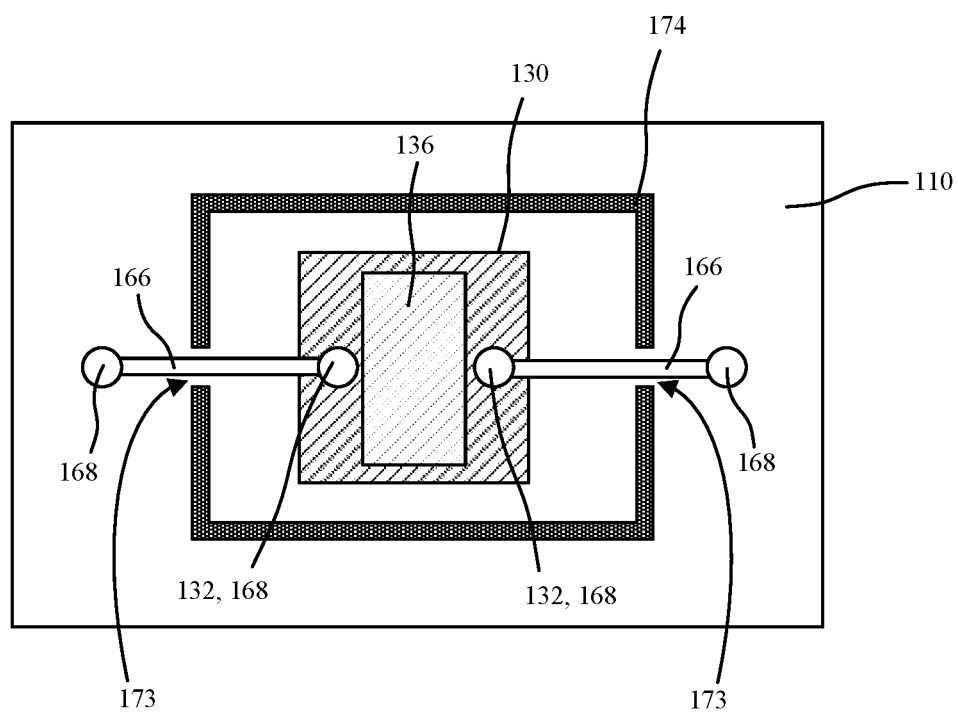
FIG. 8 is a top view illustration of an optical package including a light blocking structure in a front side routing layer in accordance with an embodiment.
Figure 9:
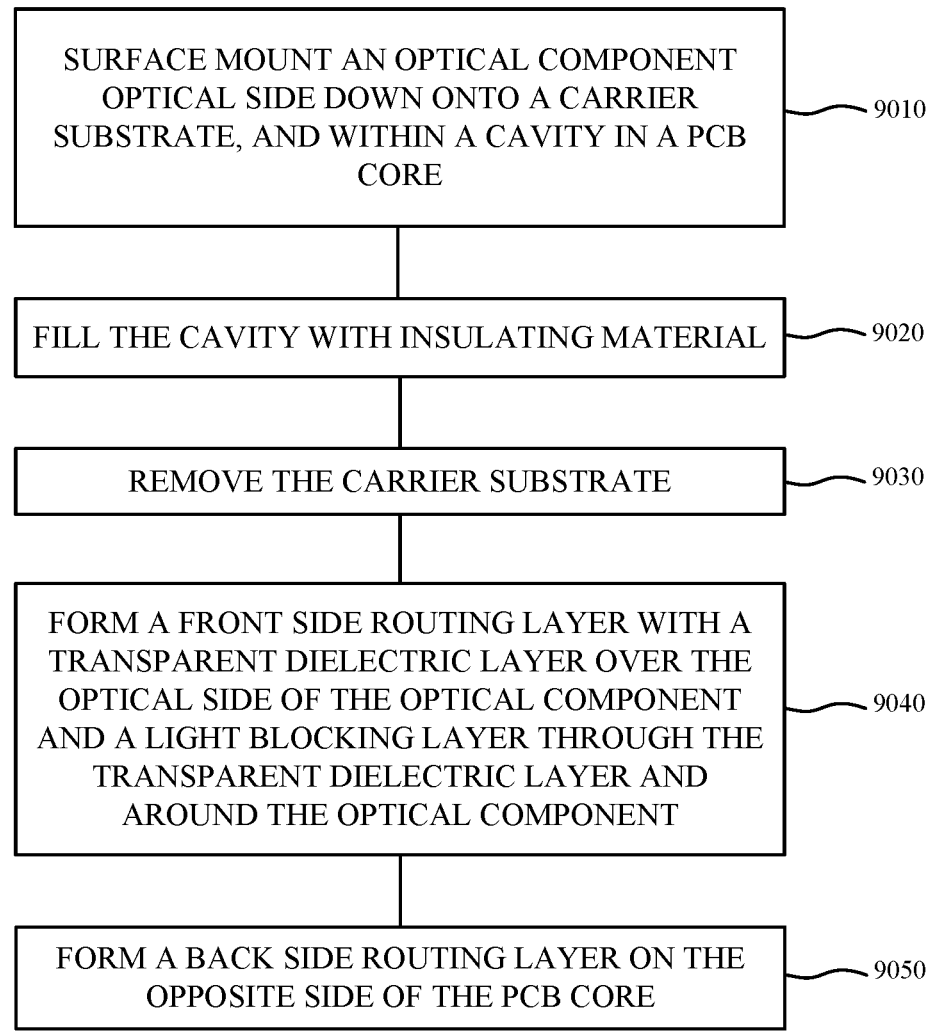
FIG. 9 is a process flow of a method of fabricating an optical package including a light blocking structure in a front side routing layer in accordance with an embodiment.

Referring now to FIGS. 7-8, schematic cross-sectional side view and top view illustrations are provided of an optical package including a light blocking structure 174 in a front side routing layer 160 in accordance with an embodiment.

In an embodiment, an optical package 100 includes a back side routing layer 102 including a top side 103 and a bottom side 104. A PCB core 110 is on the top side 103 of the back side routing layer 102. The PCB core additionally includes a plurality of vias 112 and a first cavity 115. An optical component (e.g. PD 130) is mounted within the first cavity 115, where a top side of the optical component includes an optical surface 136. An insulating material 107 encapsulates the optical component within the first cavity 115. A front side routing layer 160 is additionally formed on top of the PCB core 110 and the optical component. In accordance with embodiments, the front side routing layer 160 may include a transparent dielectric layer 164 spanning over the optical component. The insulating material 107 in accordance with the embodiments illustrated in FIGS. 7-8 may be a transparent material, and may spread over the top side of the optical component, including the optical surface 136. The transparent insulating material 107 may also spread over a portion of the front side 119 of the PCB core 110. As shown, a front side routing layer 160 is formed on top of the PCB core 110 and the optical component (e.g. PD 130). The front side routing layer 160 may additionally include a transparent dielectric layer 164 spanning over the optical component and a light blocking structure 174 extending through the transparent dielectric layer 164.

As shown in FIG. 8, the light blocking structure 174 can laterally surround the optical surface 136 of the optical component, and may also surround a perimeter of the optical component (e.g. PD 130). The light blocking structure 174 may be formed of the same material used to form vias 168 and optionally wiring traces 166. The light blocking structure 174 additionally may be electrically isolated, or floating. There may additionally be openings 173 within the light blocking structures, for example to allow wiring trace 166 routing to pass through.

It is to be appreciated the illustrations of FIGS. 7-8 are close up illustrations, and the optical package 100 can further include a controller chip 120 mounted face up within a second cavity 115 in the PCB core 110, and the front side routing layer spans over and makes electrical contact with the controller chip 120. Additional optical components (e.g.

emitter 140) can also be mounted in the PCB core 110 as previously described. In an exemplary embodiment, a portion of the insulating material 107 spans over a back side of the PCB core, and a plurality of vias 108 extend through the insulating material 107 to contact the PCB core.

Referring now to FIG. 9 and FIGS. 10A-10K, FIG. 9 is a process flow of a method of fabricating an optical package including a light blocking structure in a front side routing layer in accordance with an embodiment; FIGS. 10A-10K are schematic cross-sectional side view illustrations of a method of fabricating an optical package including light blocking structure in a front side routing layer in accordance with an embodiment.

Figure 10A:
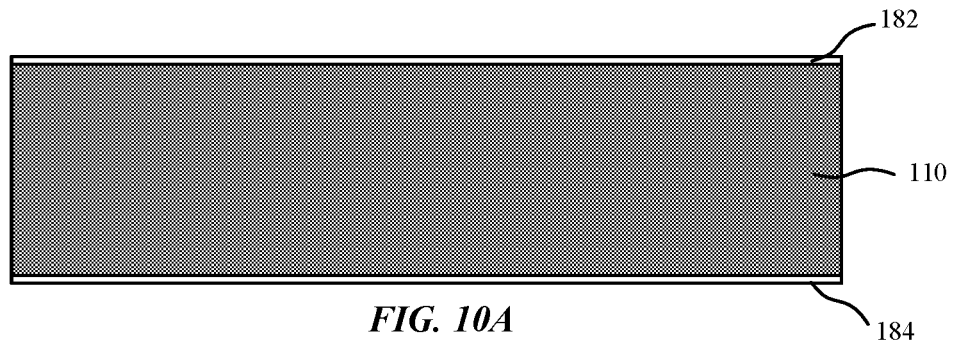
FIGS. 10A-10K are schematic cross-sectional side view illustrations of a method of fabricating an optical package including light blocking structure in a front side routing layer in accordance with an embodiment.
Figure 10B:
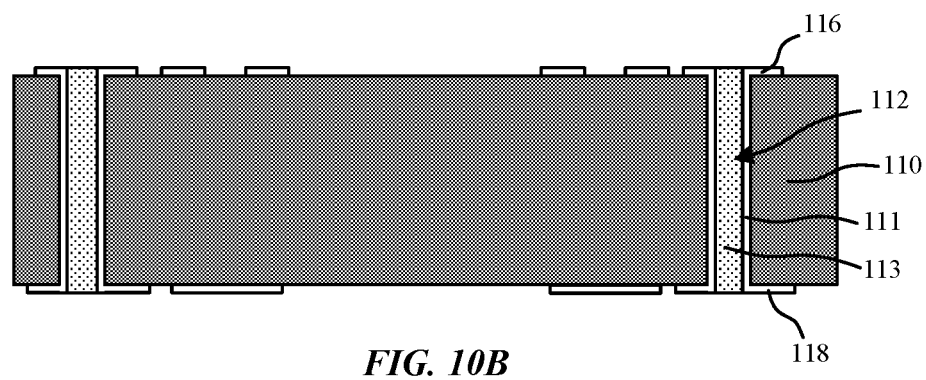
Figure 10C:
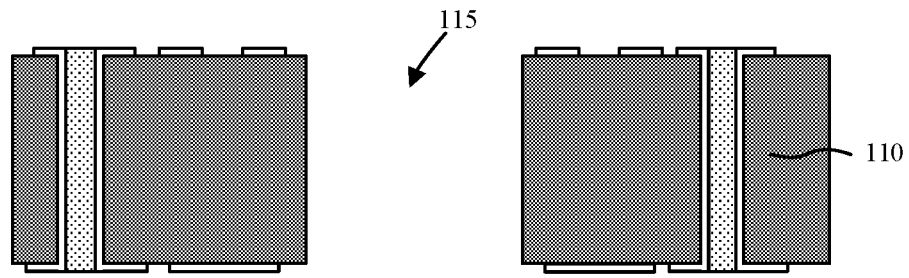
Figure 10D:
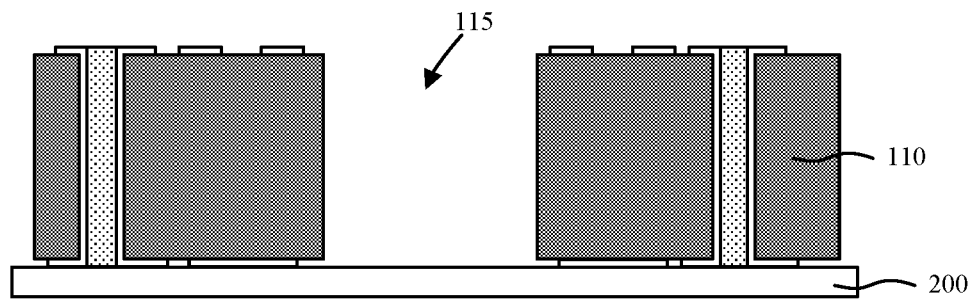
Figure 10E:
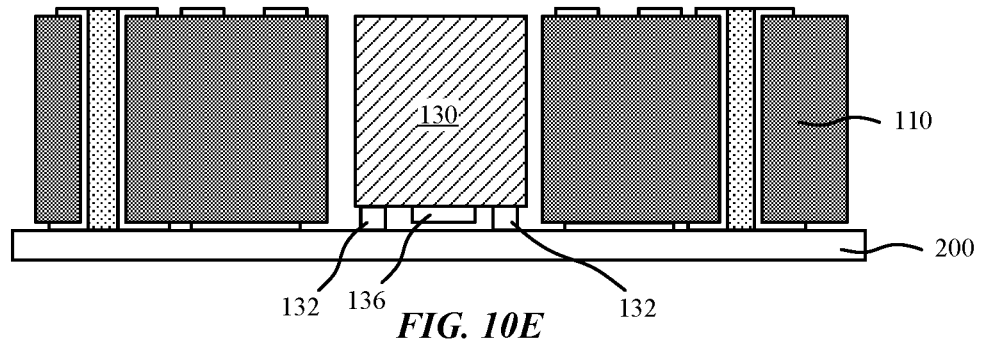
Figure 10F:
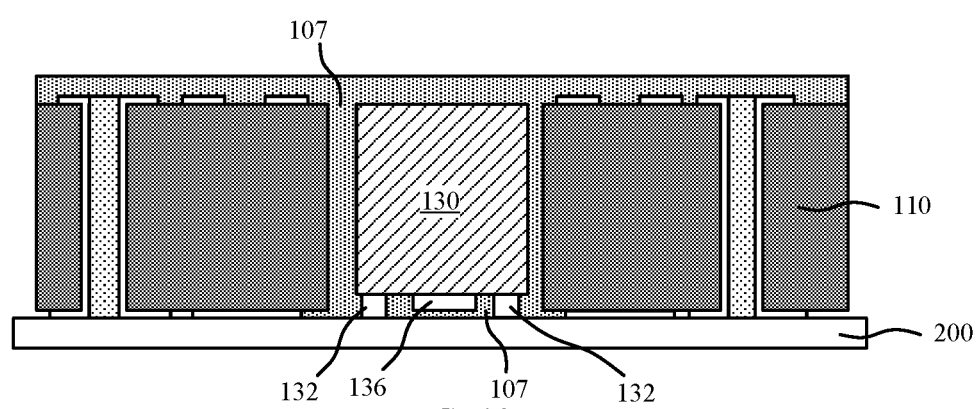

As shown in FIGS. 10A-10D, the process sequence may begin with patterning a PCB core 110 similarly as illustrated with regard to FIGS. 6A-6D. Referring now to FIG. 10E, at operation 9010 the one or more optical components are mounted optical side down (including the optical surface) onto the carrier substrate 200 and within a corresponding cavity 115 in the PCB core 110. The optical component may include one or more terminals 132 that may contact the carrier substrate 200 or intervening adhesive layer. An insulating material 107 is then applied over the optical component to fill the cavity 115 at operation 9020 as shown in FIG. 10F. The insulating material 107 may also span over the back side 117 of the PCB core 110. The insulating material 107 may be applied using a suitable dispensing technique (e.g. slot coat, ink jet printing, etc.), cavity molding technique, or lamination technique such as lay-up press in which a sheet of insulating material 107 is applied, heated, and pressed into shape. Each deposition technique may include flow of the insulating material 107, which may optionally flow over the optical surface 136, though this is not required. As such, the insulating material 107 may be transparent.

Figure 6K:
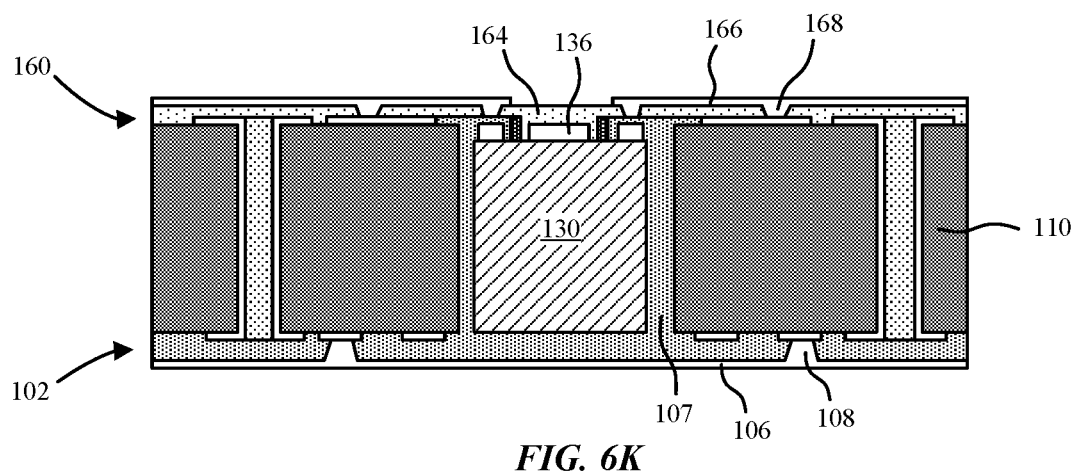
Figure 10G:
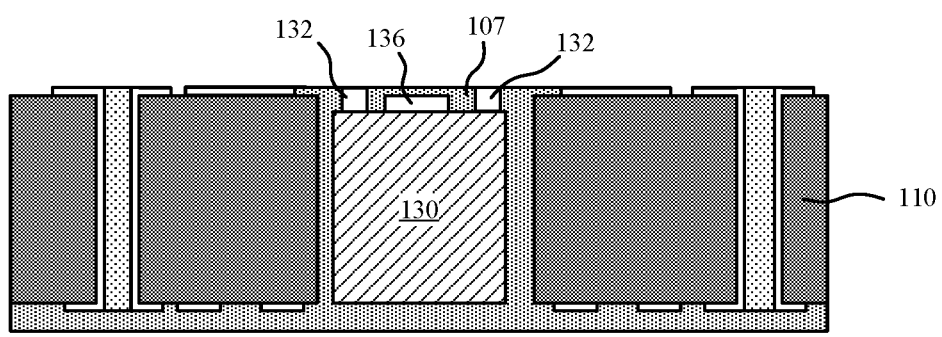
Figure 10H:
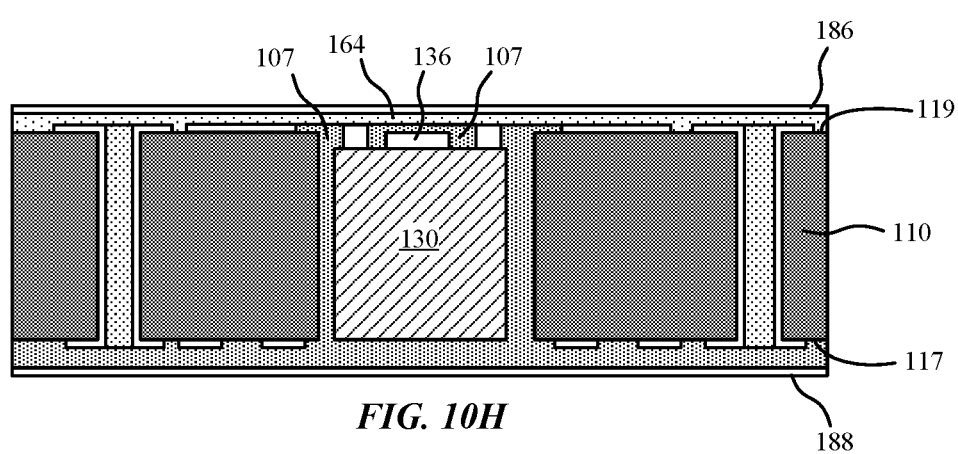
Figure 10I:
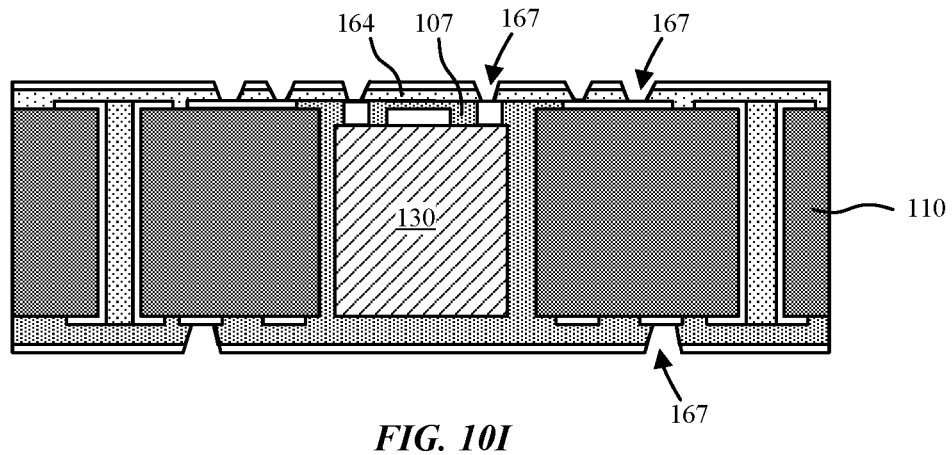
Figure 10J:
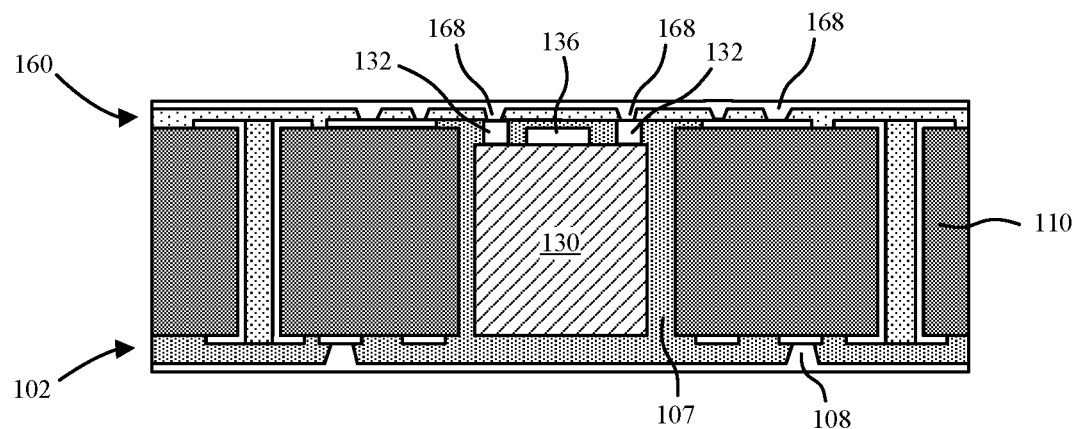
Figure 10K:
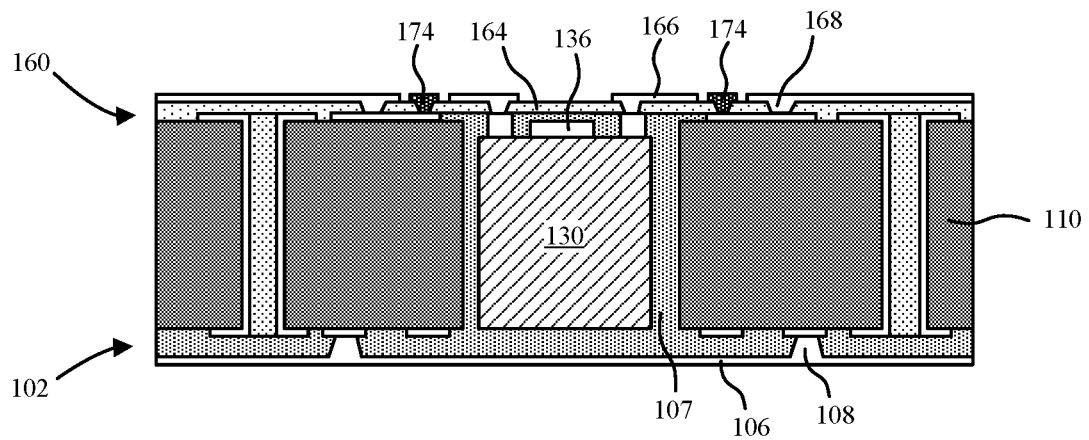

The carrier substrate 200 and any intermediate layer can then be removed at operation 9030, as shown in FIG. 10G, followed by the formation of a front side routing layer 160 at operation 9040 and back side routing layer 102 at operation 9050. As shown in FIGS. 10H-10K, the front side routing layer 160 and back side routing layer 102 may be formed using similar techniques as previously described with regard to FIGS. 6H-6K, without the guard fence 172. As shown in FIG. 6K, a light blocking structure 174 can be formed as part of the front side routing layer 160 using the same metal layers, and vias, where the light blocking structure 174 can be electrically isolated from the other wiring traces within the same metal layers.

Figure 11A:
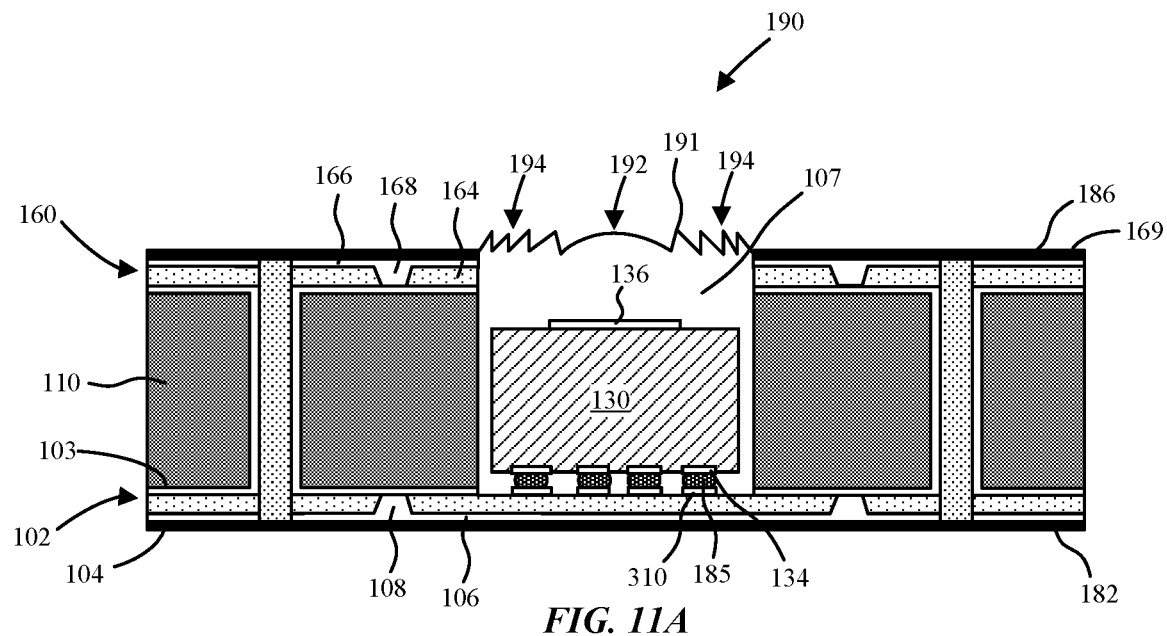
FIG. 11A is a schematic cross-sectional side view illustration of an optical package including an optical component and optical lens in accordance with an embodiment.
Figure 11B:
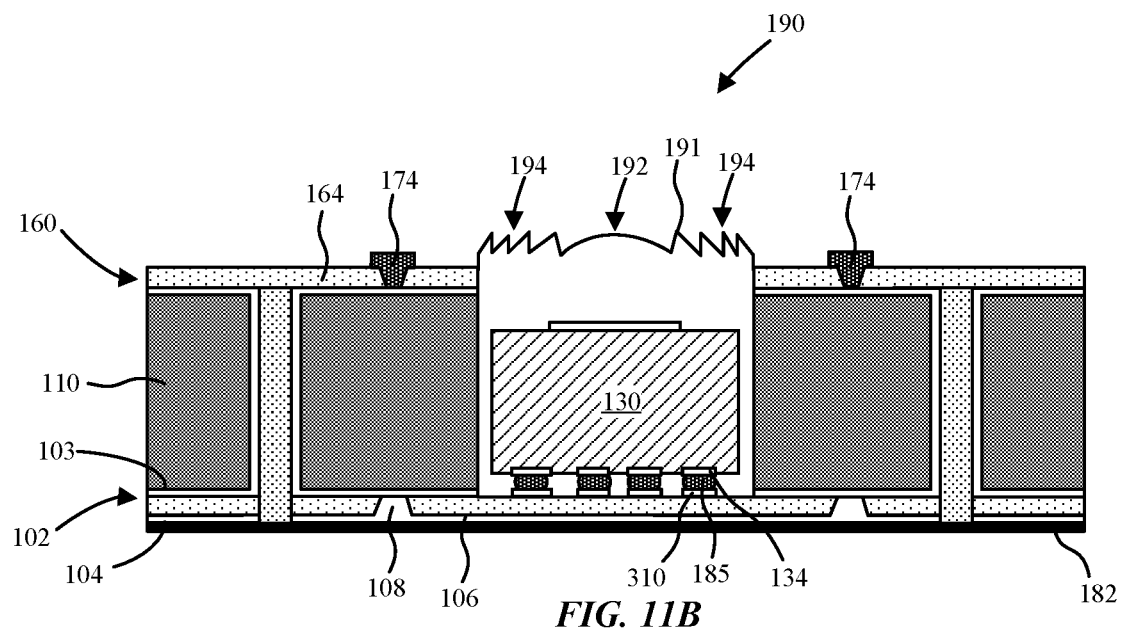
FIG. 11B is a schematic cross-sectional side view illustration of an optical package including an optical component and optical lens and light blocking structure in accordance with an embodiment.
Figure 12:
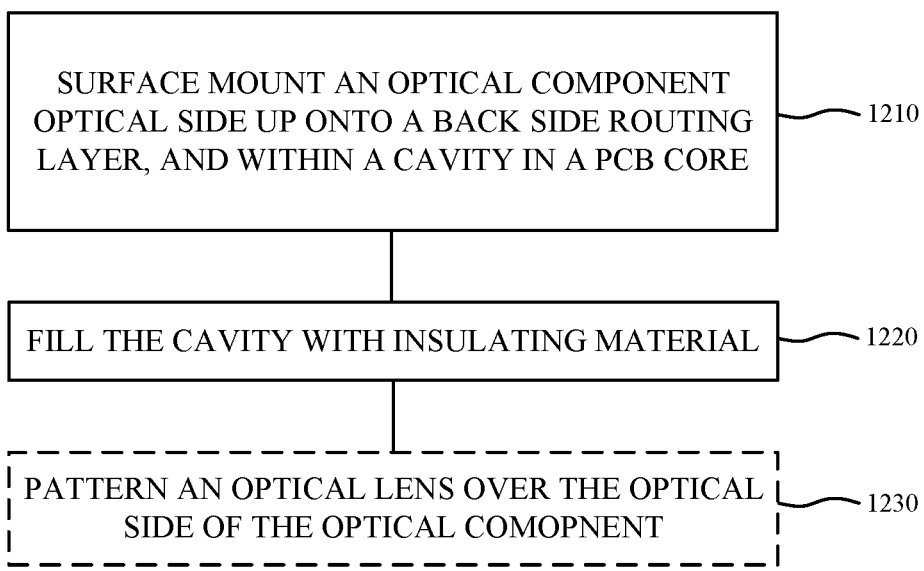
FIG. 12 is a process flow of a method of fabricating an optical package including an optical component and optical lens in accordance with an embodiment.

Referring now to FIGS. 11A-11B schematic cross-sectional side view illustrations are provided of an optical package 100 including an optical component and optical lens 190 in accordance with embodiments. In the embodiment illustrated in FIG. 11B a light blocking structure 174 can optionally surround the optical lens 190. This may be included where the front side routing layer 160 includes transparent dielectric layer(s). Where front side routing layer 160 is opaque, a light blocking structure 174 is not included, as shown in FIG. 11A. The optical packages of FIGS. 11A-11B are distinguishable over the optical packages described thus far in that the optical components (e.g. PD 130) can be surface mounted, for example, with solder material.

In an embodiment, an optical package 100 includes a back side routing layer 102 including a top side 103 and a bottom side 104. A PCB core 110 is on the top side 103 of the back side routing layer 102. The PCB core additionally includes a plurality of vertical vias 112 and a first cavity 115. A front side routing layer 160 is formed on top of the PCB core 110, and an optical component (e.g. PD 130) is mounted within the first cavity 115. In the illustrated embodiment, a top side of the optical component includes an optical surface 136, an insulating material 107 encapsulates the optical component within the first cavity. In accordance with embodiments, the front side routing layer 160 does not span directly over the optical surface 136. In the illustrated embodiment, the front side routing layer 160 does not span directly over the optical component, or even directly over the first cavity 115.

The insulating material 107 may be formed of a transparent material and may form an optical lens 190 over the optical surface 136 of the optical component. As shown, the insulating material 107 may include a top surface 191 that extends above a top side 169 of the front side routing layer 160. The top surface of the insulating material 107 may be textured. In an embodiment, the top surface includes a dome contour 192. In an embodiment, the top surface includes a textured area 194 surrounding a dome contour 192. In an embodiment, the optical lens 190 is a Fresnel lens including a set of concentric annual sections (i.e. the textured area 194).

It is to be appreciated the illustrations of FIGS. 11A-11B are close up illustrations, and the optical package 100 can further include a controller chip 120 mounted face up within a second cavity 115 in the PCB core 110, and the front side routing layer spans over and makes electrical contact with the controller chip 120. Additional optical components (e.g. emitter 140) can also be mounted in the PCB core 110 as previously described. In an exemplary embodiment, a portion of the insulating material 107 spans over a back side of the PCB core, and a plurality of vias 108 extend through the insulating material 107 to contact the PCB core.

Referring now to FIG. 12 and FIGS. 13A-13K, FIG. 12 is a process flow of a method of fabricating an optical package including an optical component and optical lens in accordance with an embodiment; FIGS. 13A-13K are schematic cross-sectional side view illustrations of a method of fabricating an optical package including an optical component and optical lens in accordance with an embodiment.

Figure 13A:
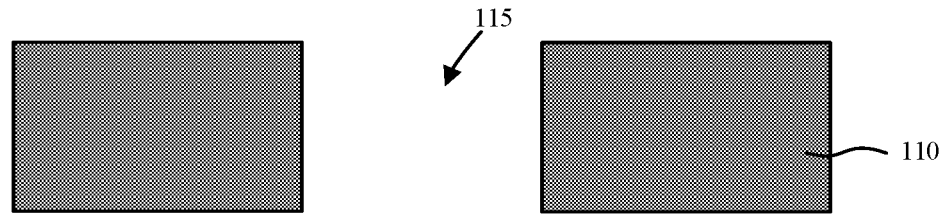
FIGS. 13A-13K are schematic cross-sectional side view illustrations of a method of fabricating an optical package including an optical component and optical lens in accordance with an embodiment.
Figure 13B:
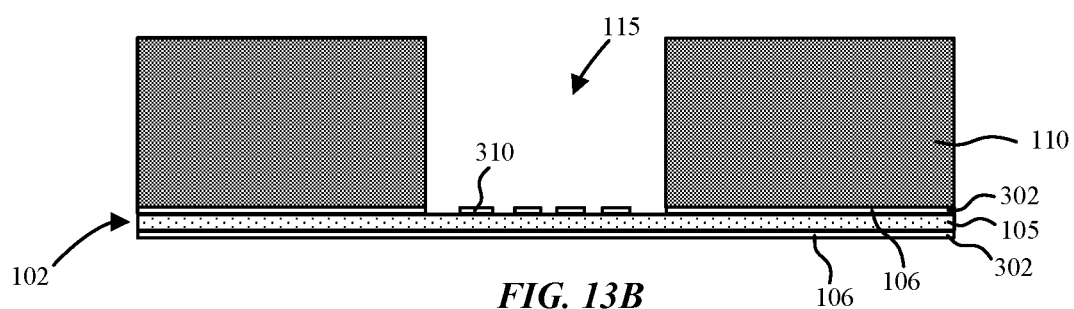
Figure 13C:
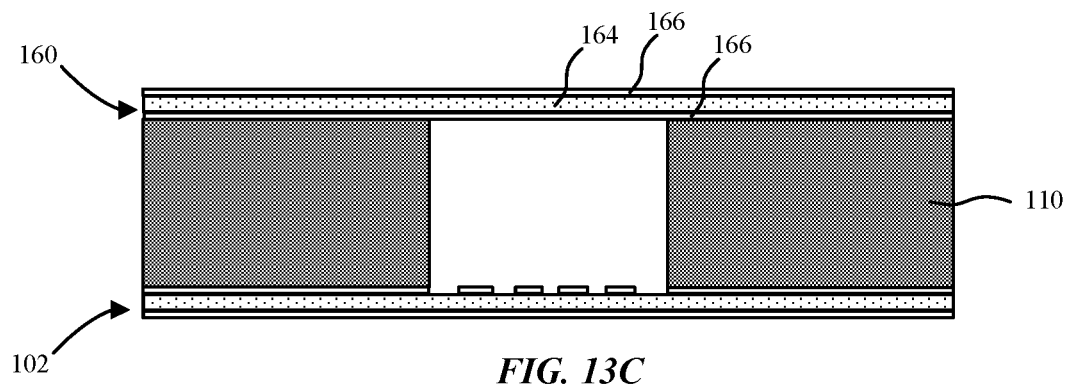
Figure 13D:
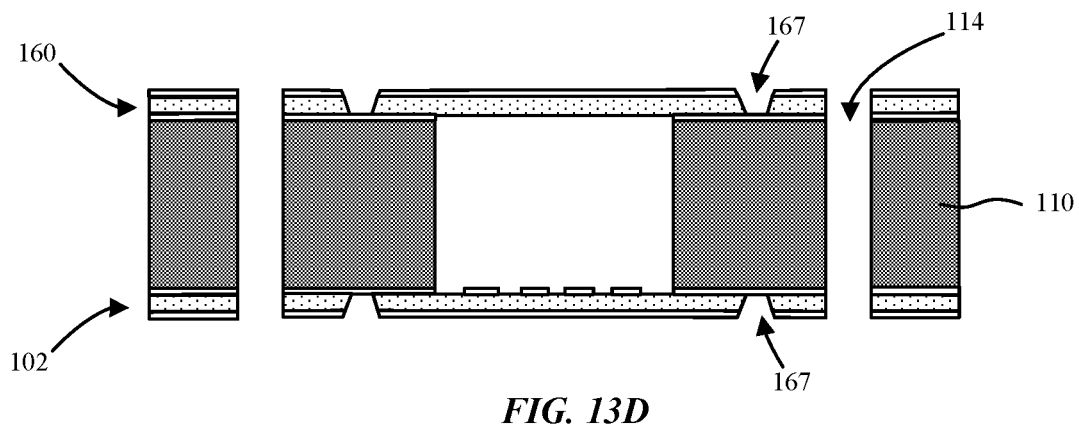
Figure 13E:
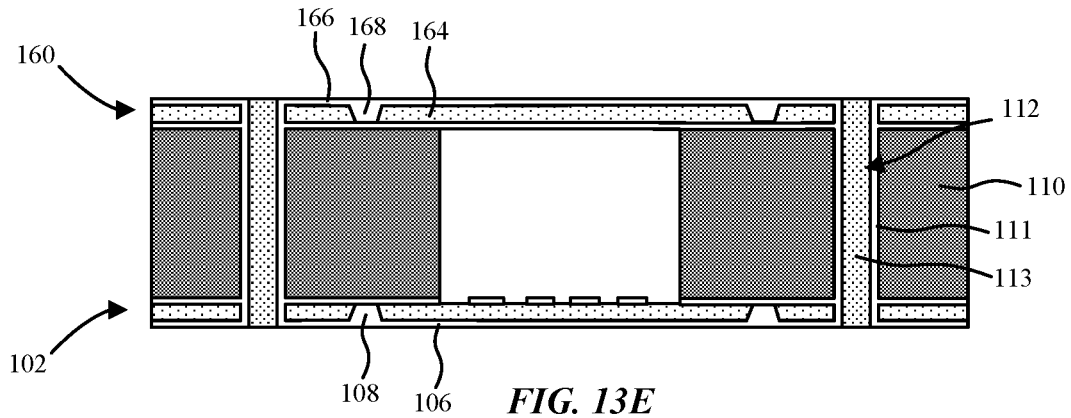
Figure 13F:
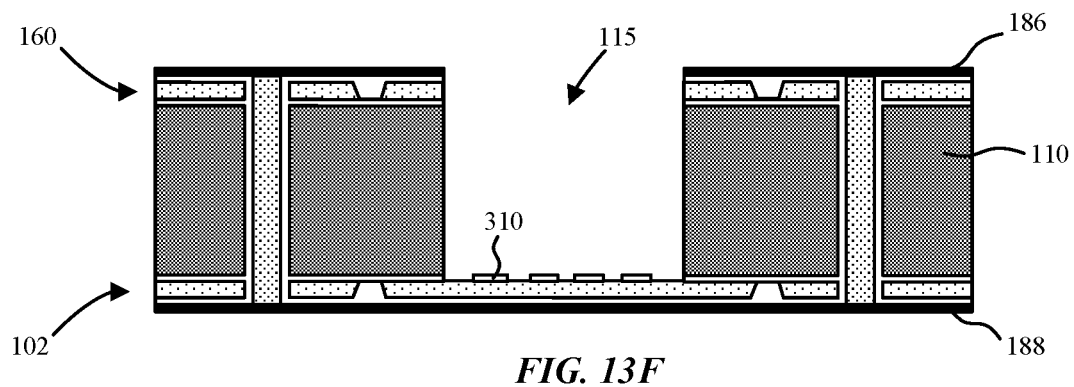
Figure 13G:
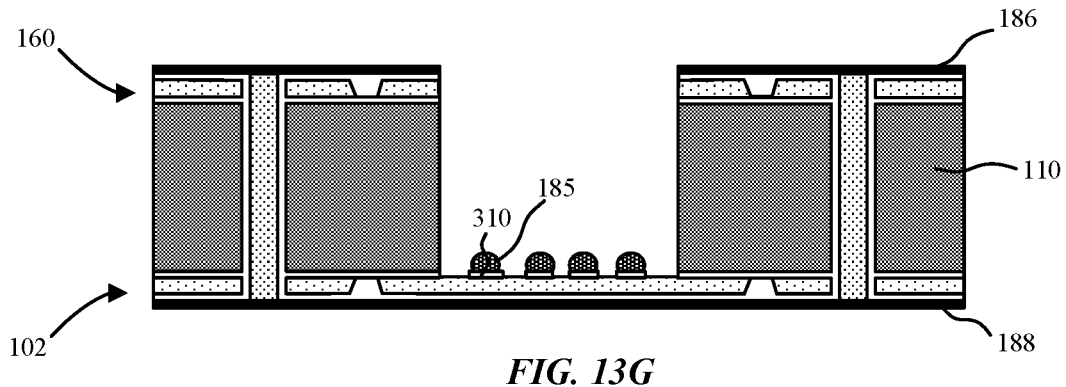

As shown in FIGS. 13A-13B, the process may begin with a slotted PCB core 110 including one or more cavities 115, which can be laminated onto a partially formed back side routing layer 102. The back side routing layer 102 may include one or more wiring traces 106 or metal layers 302 and dielectric layers 105. The top metal layer 302 may include a plurality of landing pads 310. Referring to FIGS. 13C-13D, a top side routing layer 160 can be laminated onto the slotted PCB core 110, followed by the formation of via openings 167 through the top and bottom side routing layers using a suitable technique such as laser drilling. Vertical via openings 114 can additionally be formed through the top and bottom side routing layers as well as the PCB core 110 using a suitable technique such as mechanical drilling or laser drilling. Plating may then be performed to form sidewall liners 111 along the vertical via openings 114, and to fill via openings 167 forming vias 168 as shown in FIG. 13E. The remaining open space within the vertical via openings 114 can remain open air, or optionally be filled with an insulating or conductive filler 113 material. Referring now to FIGS. 13F-13G the portion of the front side routing layer 160 overhanging the cavity 115 can be cut away, such as with laser cutting, followed by dispensing of solder bumps 185 onto landing pads 310. Prior to the cutting operation, solder mask layers 186, 188 can optionally be formed over the front and back side routing layers.

Figure 13H:
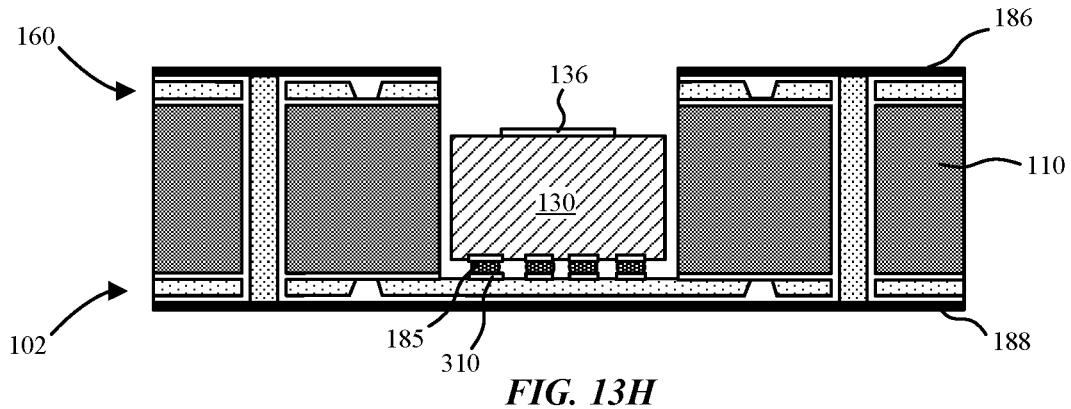
Figure 13I:
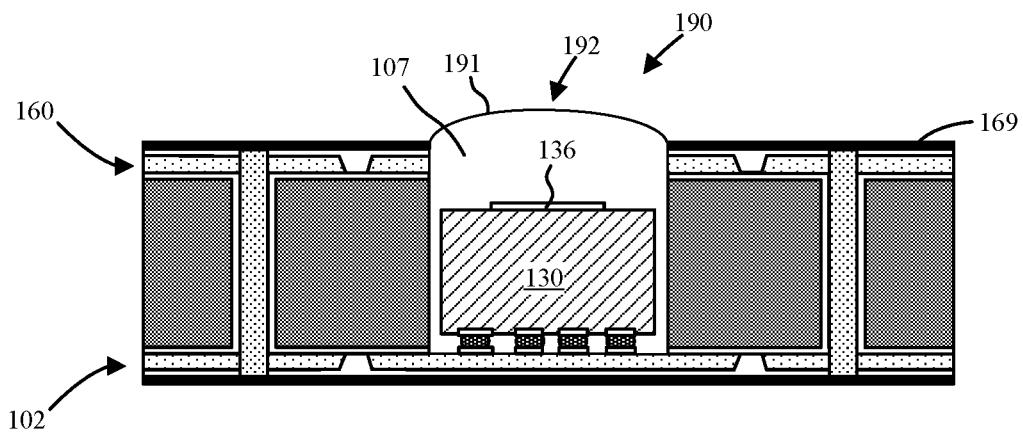

At operation 1210 an optical component (e.g. PD 130) is surface mounted optical side up onto the back side routing layer 102 and within the cavity 115 in the PCB core 110, as shown in FIG. 13H. At operation 1220 the cavity 115 is filled with an insulating material 107, which may be a transparent material. The insulating material 107 may be deposited using a dispensing technique, and may be molded such as with compression molding. In an embodiment, the insulating material includes a top surface 191 above a top side of the front side routing layer 160. Additionally, the insulating material 107 may include an optical lens 190, such as a dome contour 192.

Figure 13J:
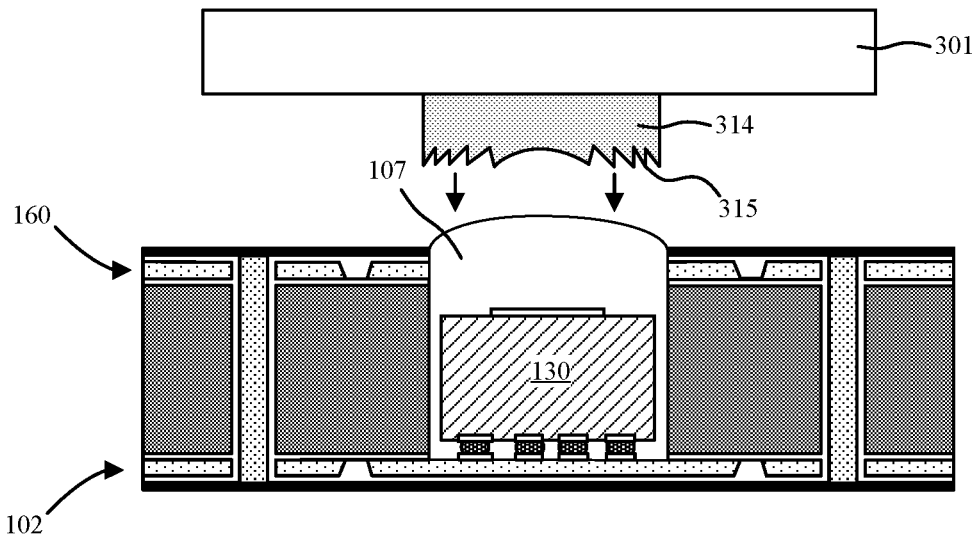
Figure 13K:
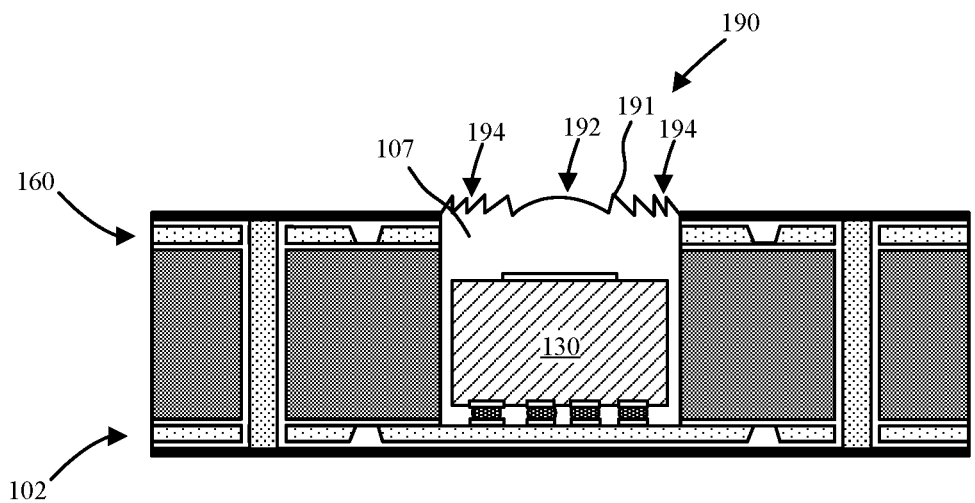

In some embodiments, the insulating material 107 can optionally be further patterned at operation 1230, for example by impressing with a lens blank. As shown in FIGS. 13J-13K, a head 301 supporting a lens blank 314 with patterned surface 315 can be positioned over, and then brought into contact with the insulating material 107 to impress, or emboss, the patterned surface 315 of the lens blank into the insulating material 107. As a result, the top surface 191 of the insulating material 107 can be patterned, including various structures such as a dome contour 192 and/or textured area 194. In an embodiment, the optical lens 190 is a Fresnel lens including a set of concentric annual sections (i.e. the textured area 194).

Figure 14:
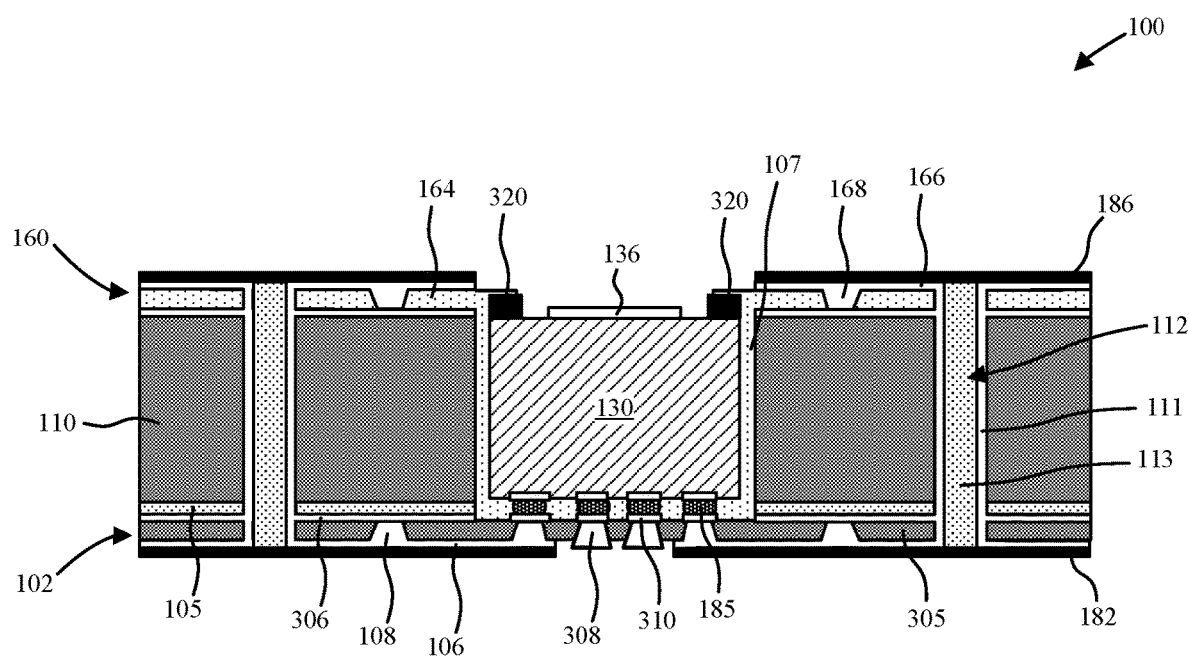
FIG. 14 is a schematic cross-sectional side view illustration of an optical package including an optical component with optical surface exposed by removal of a sacrificial layer in accordance with an embodiment.
Figure 15:
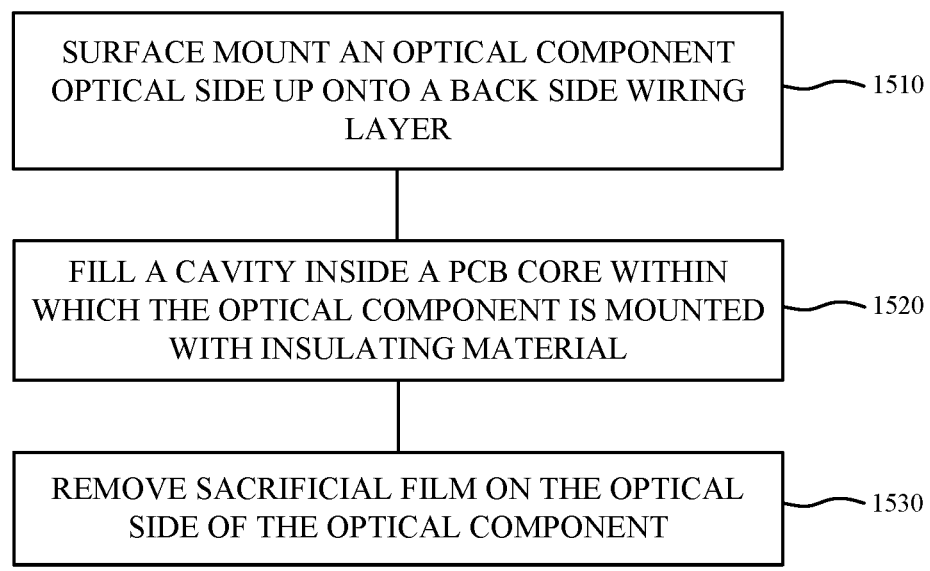
FIG. 15 is a process flow of a method of fabricating an optical package including an optical component with optical surface exposed by removal of a sacrificial layer in accordance with an embodiment.

Referring now to FIG. 14, a schematic cross-sectional side view illustration is provided of an optical package 100 including an optical component with optical surface 136 exposed by removal of a sacrificial layer 320, such as adhesive tape layer, in accordance with an embodiment. FIG. 15 is a process flow of a method of fabricating an optical package including an optical component with optical surface exposed by removal of a sacrificial layer in accordance with an embodiment. FIGS. 16A-16H are schematic cross-sectional side view illustrations of a method of fabricating an optical package including an optical component with optical surface exposed by removal of a sacrificial layer in accordance with an embodiment. In interest of clarity and conciseness FIGS. 14-16H are discussed concurrently.

Figure 16A:
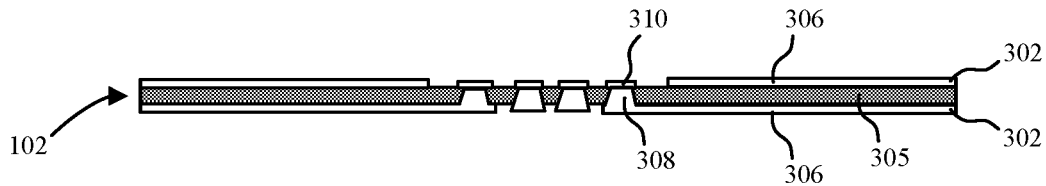
FIGS. 16A-16H are schematic cross-sectional side view illustrations of a method of fabricating an optical package including an optical component with optical surface exposed by removal of a sacrificial layer in accordance with an embodiment.
Figure 16B:
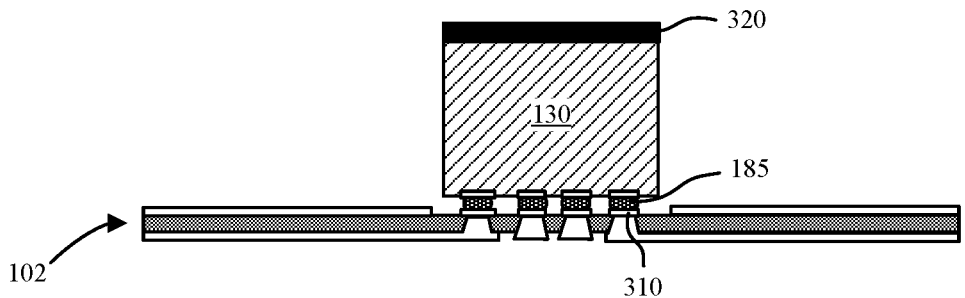

Referring to FIG. 16A the process sequence may begin with back side routing layer 102 as a pre-fabricated PCB including one or more metal layers and dielectric layers. As shown, the back side routing layer 102 can include a plurality of vias 308 and wiring traces 306 or metal layers 302, and one or more dielectric layers 305. The back side routing layer 102 may additionally include a plurality of patterned landing pads 310 in the top metal layer 302. At operation 1510 an optical component (e.g. PD 130) is surface mounted optical side up onto the back side routing layer 102. For example, this may be accomplished with a plurality of solder bumps 185 pre-applied to the landing pads 310 and/or to the optical component. As shown, optical component may include a sacrificial layer 320 on an optical side of the optical component. The sacrificial layer 320 can cover the optical surface 136 (see FIG. 14).

Figure 16C:
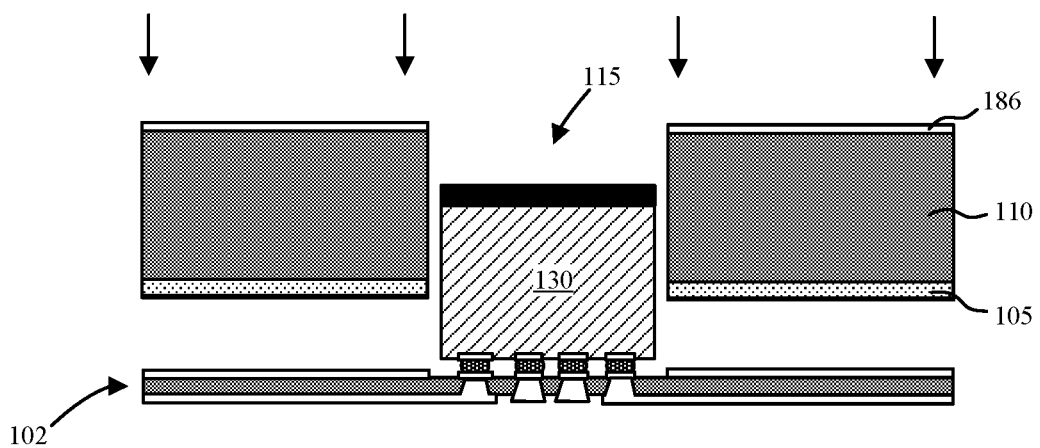

Referring now to FIG. 16C, a PCB core 110 is laminated onto the back side routing layer 102. The PCB core 110 may include a pre-formed cavity 115, such that the PCB core 110 is mounted around the optical component. Alternatively, the optical component can be surface mounted after lamination of the PCB core 110.

In accordance with embodiments, the PCB core 110 includes a pre-fabricated top side metal layer 186, and bottom side adhesive or dielectric layer 105. It is to be appreciated however, that this configuration is merely exemplary. Continuing with the exemplary configuration, referring to FIG. 16D the front side routing layer 160 is fabricated. This may include laminating/depositing dielectric layer 186 and insulating material 107, which can be separate layers or the same layer of the same material, as well as forming/laminating the top metal layer 186. As shown, the top metal layer 186 may optionally span over the optical component and cavity 115.

Figure 16D:
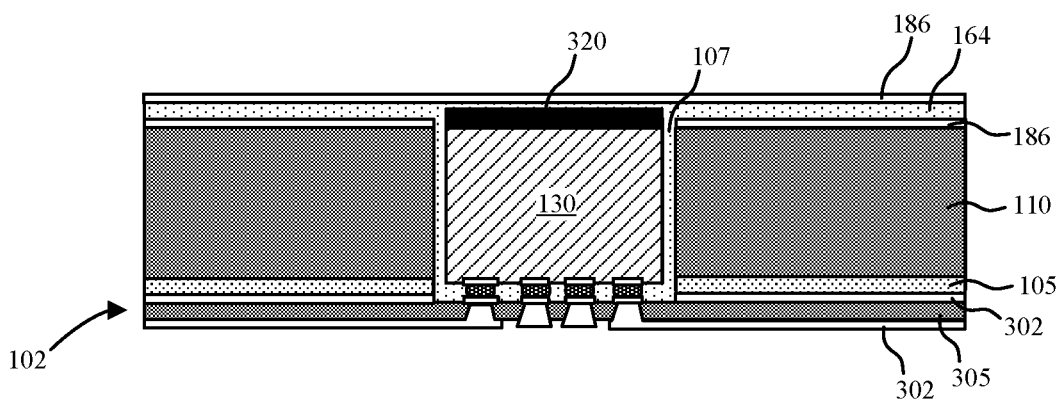

In accordance with embodiments, a top side routing layer 160 can optionally be pre-formed or partially pre-formed on the PCB core 110. For example, the top side routing layer 160 can include metal layers 186 and one or more dielectric layers 164. The metal layers 186 may be pre-patterned to include wiring traces 166. Alternatively, the top side routing layer 160 can be formed after mounting the PCB core 110, followed by cutting through the top side routing layer 160 to expose the cavity 115. In both process sequences, the cavity can be filled with an insulating material 107, which can be transparent or opaque, at operation 1520. The insulating material 107 may optionally cover the sacrificial layer 320 as shown in FIG. 16D. In an embodiment, the insulating material 107 and dielectric layer 164 are the same layer/material and may be opaque.

Figure 16E:
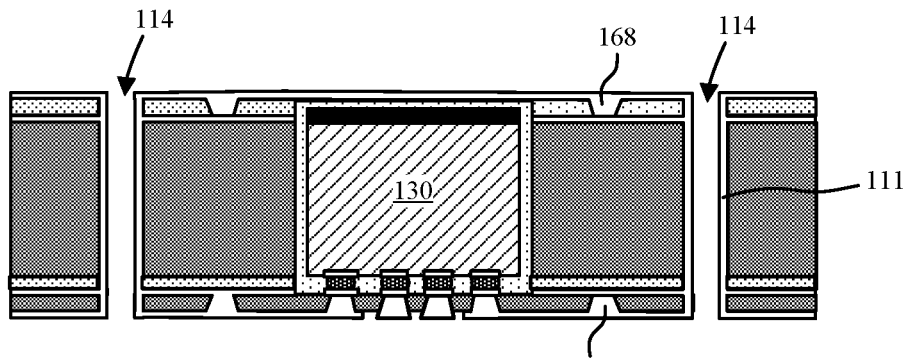
Figure 16F:
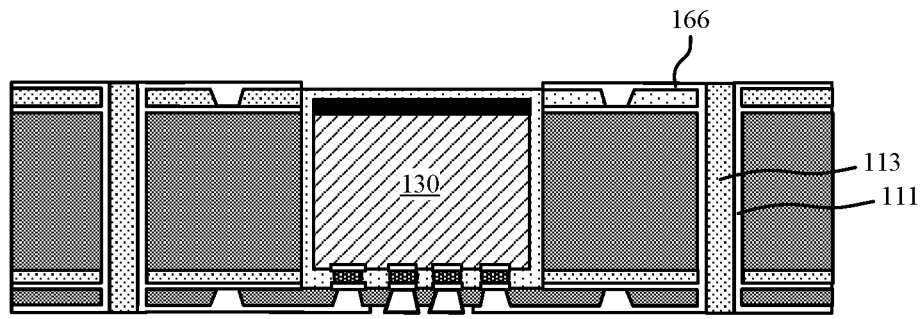
Figure 16G:
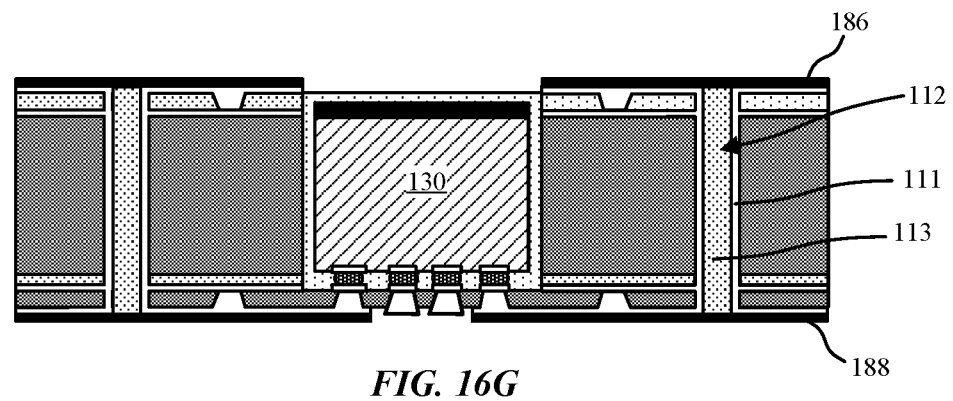
Figure 16H:
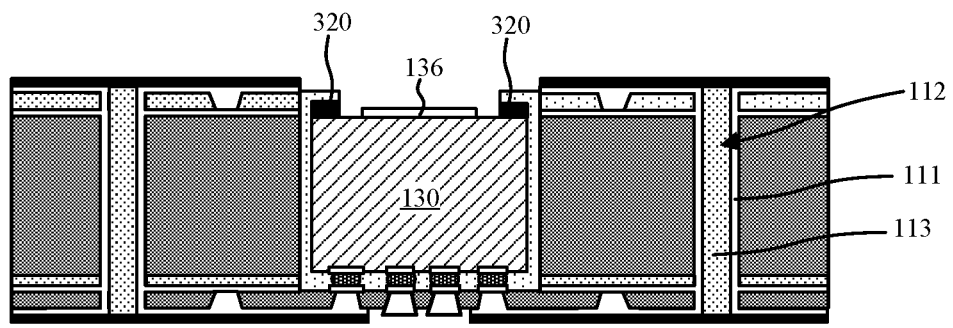

Referring now to FIG. 16E via openings and vertical vias openings 114 may be formed as previously described using suitable techniques such as laser etching and/or laser drilling followed by plating to form vias 168, 108 and sidewall liners 111. Referring to FIG. 16F, the remaining volume of vertical via openings 114 may optionally be filled with a filler 113, and the top metal layer 186 can be patterned for circuit formation, including formation of wiring traces 166 and to uncover the underlying optical component (e.g. PD 130). This may be followed by formation of patterned solder mask layers 186, 188 as shown in FIG. 16G, followed by removal of the sacrificial layer on the optical side of the optical component at operation 1530, as shown in FIG. 16H. For example, removal of the sacrificial layer may include laser cutting and chemical etching/cleaning to remove a sacrificial layer 320 formed of an adhesive tape. In some embodiments a residual edge portion of the sacrificial layer 320 may remain, for example laterally surrounding the optical surface 136.

It is to be appreciated the illustrations of FIGS. 14-16H are close up illustrations, and the optical package 100 can further include a controller chip 120 mounted face up within a second cavity 115 in the PCB core 110, and the front side routing layer spans over and makes electrical contact with the controller chip 120. Additional optical components (e.g. emitter 140) can also be mounted in the PCB core 110 as previously described.

Figure 17A:
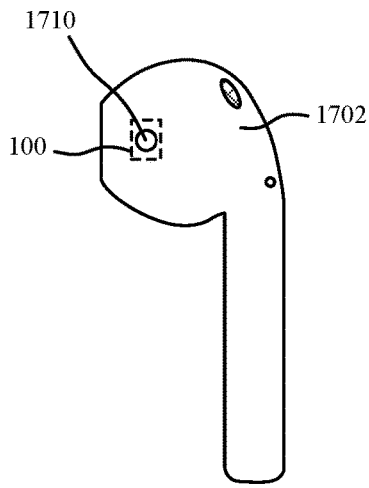
FIGS. 17A-17B are schematic side view illustrations of an earbud in accordance with an embodiment.
Figure 17B:
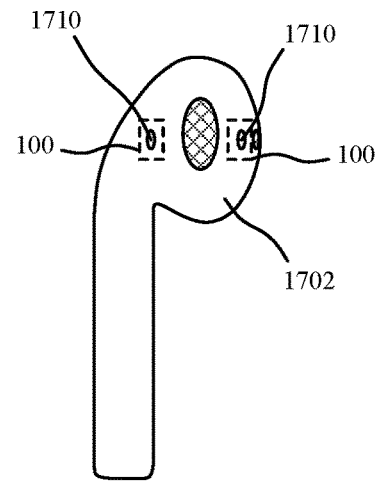
Figure 18:
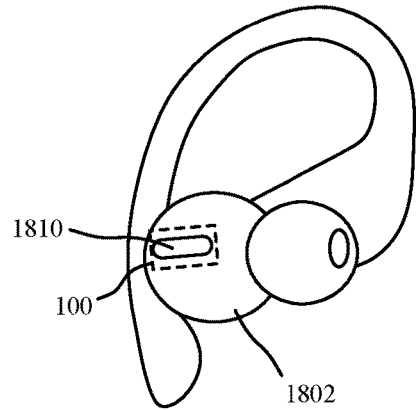
FIG. 18 is a schematic side view illustration of an earpiece in accordance with an embodiment.
Figure 19:
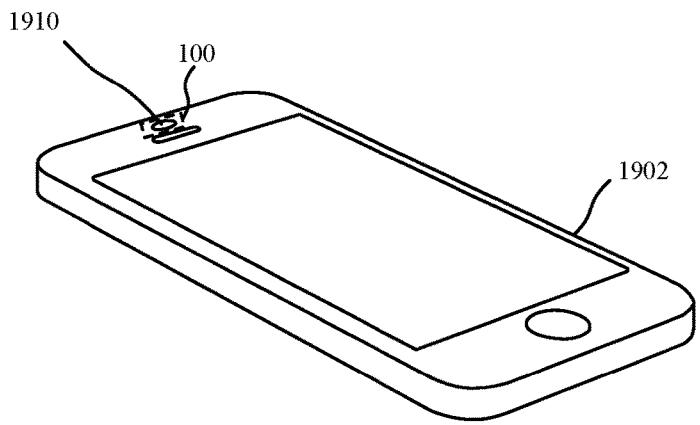
FIG. 19 is a schematic side view illustration of a mobile phone in accordance with an embodiment.

FIGS. 17A-19 illustrate various portable electronic devices in which the various embodiments can be implemented. FIGS. 17A-17B are schematic side view illustrations of an earbud in accordance with an embodiment that includes a housing 1702 and one or more openings 1710 to which the optical surfaces of the optical packages 100 described herein can be aligned. FIG. 18 is a schematic side view illustration of an earpiece in accordance with an embodiment that includes a housing 1802 including an opening 1810 to which the optical surfaces of the optical packages 100 described herein can be aligned. FIG. 19 is a schematic side view illustration of a mobile phone in accordance with an embodiment including a housing 1902 including an opening 1910 to which the optical surfaces of the optical packages 100 described herein can be aligned. These illustrations are intended to be exemplary and non-exhaustive implementations. For example, one or more of the optical packages 100 may be implemented in any wearable electronic device, such s a head-mounted device, smart watch, or any other electronic device in contact with a user's body.

In utilizing the various aspects of the embodiments, it would become apparent to one skilled in the art that combinations or variations of the above embodiments are possible for forming an optical package. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical package comprising:
    a back side routing layer including a top side and bottom side;
    a printed circuit board (PCB) core on the top side of the back side routing layer, the PCB core including a plurality of vertical vias and a first cavity;
    an optical component mounted within the first cavity, wherein a top side of the optical component includes a guard fence surrounding an optical surface;
    an insulating material encapsulating the optical component within the first cavity, wherein the insulating material does not penetrate inside the guard fence; and
    a front side routing layer on top of the PCB core and the optical component, wherein the front side routing layer includes a transparent dielectric layer spanning over the optical component.

2. The optical package of claim 1, wherein the insulating material is opaque.

3. The optical package of claim 2, wherein the transparent dielectric layer at least partially fills a volume inside the guard fence.

4. The optical package of claim 1, wherein the top side of the optical component includes a first contact terminal, and the front side routing layer includes a wiring trace in electrical contact with the first contact terminal.

5. The optical package of claim 4, wherein the contact terminal is outside of the guard fence.

6. The optical package of claim 5, wherein a surrounding top surface of the guard fence is elevated above a first top surface of the first contact terminal.

7. The optical package of claim 1, further comprising a controller chip mounted face up within a second cavity in the PCB core, and the front side routing layer spans over and makes electrical contact with the controller chip.

8. The optical package of claim 1, wherein the back side routing layer includes:
    a portion of the insulating material spanning over a back side of the PCB core; and
    a plurality of vias extend through the insulating material to contact the PCB core.

* * * * *